US012183817B2

(12) United States Patent
Motoyoshi et al.

(10) Patent No.: US 12,183,817 B2
(45) Date of Patent: Dec. 31, 2024

(54) MONOLITHIC SEMICONDUCTOR DEVICE AND HYBRID SEMICONDUCTOR DEVICE

(71) Applicant: NUVOTON TECHNOLOGY CORPORATION JAPAN, Kyoto (JP)

(72) Inventors: Kaname Motoyoshi, Hyogo (JP); Masatoshi Kamitani, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 504 days.

(21) Appl. No.: 17/487,785

(22) Filed: Sep. 28, 2021

(65) Prior Publication Data

US 2022/0020873 A1 Jan. 20, 2022

Related U.S. Application Data

(63) Continuation of application No. PCT/JP2020/013168, filed on Mar. 24, 2020.

(Continued)

(51) Int. Cl.
*H01L 29/778* (2006.01)
*H01L 23/66* (2006.01)
(Continued)

(52) U.S. Cl.
CPC .......... *H01L 29/7786* (2013.01); *H01L 23/66* (2013.01); *H01L 25/16* (2013.01);
(Continued)

(58) Field of Classification Search
CPC ..... H01L 29/7786; H01L 23/66; H01L 25/16; H01L 29/2003; H01L 2223/665;
(Continued)

(56) References Cited

U.S. PATENT DOCUMENTS

| 4,207,538 A * | 6/1980 | Goel ....................... H03F 1/306 330/277 |
| 6,188,283 B1 * | 2/2001 | Hagio ................... H03F 1/0261 330/285 |

(Continued)

FOREIGN PATENT DOCUMENTS

| JP | 57-202774 A | 12/1982 |
| JP | 01-132171 A | 5/1989 |

(Continued)

OTHER PUBLICATIONS

Extended European Search Report dated Apr. 12, 2022 for the corresponding European Patent Application No. 20784869.8.

(Continued)

*Primary Examiner* — Bitew A Dinke
(74) *Attorney, Agent, or Firm* — Rimon P.C.

(57) ABSTRACT

A monolithic semiconductor device includes: a substrate; a first nitride semiconductor layer disposed on the substrate; a second nitride semiconductor layer disposed on the first nitride semiconductor layer and having a band gap larger than a band gap of the first nitride semiconductor layer; a first transistor disposed on the substrate and including the first nitride semiconductor layer and the second nitride semiconductor layer, the first transistor being of a high-electron-mobility transistor (HEMT) type for power amplification; and a first bias circuit disposed on the substrate and including a second transistor of the HEMT type disposed outside a propagation path of a radio-frequency signal inputted to the first transistor, the first bias circuit applying bias voltage to a gate of the first transistor.

14 Claims, 24 Drawing Sheets

Related U.S. Application Data

(60) Provisional application No. 62/827,622, filed on Apr. 1, 2019.

(51) Int. Cl.
*H01L 25/16* (2023.01)
*H01L 29/20* (2006.01)
*H03F 1/02* (2006.01)
*H03F 3/195* (2006.01)
*H03F 3/213* (2006.01)

(52) U.S. Cl.
CPC ....... *H01L 29/2003* (2013.01); *H03F 1/0288* (2013.01); *H03F 3/195* (2013.01); *H03F 3/213* (2013.01); *H01L 2223/665* (2013.01); *H01L 2223/6655* (2013.01); *H01L 2223/6672* (2013.01); *H03F 2200/294* (2013.01); *H03F 2200/447* (2013.01); *H03F 2200/451* (2013.01)

(58) Field of Classification Search
CPC ..... H01L 2223/6655; H01L 2223/6672; H01L 21/8252; H01L 27/0629; H01L 27/0605; H01L 29/86; H03F 1/0288; H03F 3/195; H03F 3/21; H03F 2200/294; H03F 2200/447; H03F 2200/451
See application file for complete search history.

(56) References Cited

U.S. PATENT DOCUMENTS

| | | | | |
|---|---|---|---|---|
| 2005/0024123 | A1* | 2/2005 | Nakamura | H03F 1/301 327/427 |
| 2007/0146079 | A1 | 6/2007 | Arnborg | |
| 2007/0229170 | A1* | 10/2007 | Maeda | H03F 1/565 330/302 |
| 2008/0211567 | A1 | 9/2008 | Morita et al. | |
| 2009/0058532 | A1 | 3/2009 | Kikkawa et al. | |
| 2009/0256637 | A1* | 10/2009 | Ishihara | H03F 1/302 330/296 |
| 2010/0097147 | A1 | 4/2010 | Hirayama | |
| 2010/0201449 | A1* | 8/2010 | Hasegawa | H03F 1/342 330/296 |
| 2011/0031532 | A1* | 2/2011 | Kikkawa | H01L 29/7783 257/E21.403 |
| 2015/0221759 | A1* | 8/2015 | Uesugi | H01L 29/0847 257/194 |
| 2017/0125533 | A1* | 5/2017 | Kotani | H01L 29/408 |

FOREIGN PATENT DOCUMENTS

| | | | |
|---|---|---|---|
| JP | 09-017955 A | | 1/1997 |
| JP | 09-083262 A | | 3/1997 |
| JP | 2000124749 A | * | 4/2000 |
| JP | 2005005944 A | * | 1/2005 |
| JP | 2005-039084 A | | 2/2005 |
| JP | 2005203514 A | * | 7/2005 |
| JP | 2009-059945 A | | 3/2009 |
| JP | 2009-124667 A | | 6/2009 |
| JP | 2010-183473 A | | 8/2010 |
| JP | 2013-140831 A | | 7/2013 |
| JP | 2015-023098 A | | 2/2015 |
| WO | 2008/023487 A1 | | 2/2008 |

OTHER PUBLICATIONS

C.H. Kim et al., "A 2.14-GHz GaN MMIC Doherty Power Amplifier for Small-Cell Base Stations," IEEE Microwave and Wireless Components Letters, vol. 24, No. 4, Apr. 2014, pp. 263-265.

D. Gustafsson et al.,"A Wideband and Compact GaN MMIC Doherty Amplifier for Microwave Link Applications," IEEE Transactions on Microwave Theory and Techniques, vol. 61, No. 2, Feb. 2013, pp. 922-930.

International Search Report and Written Opinion issued on Jun. 23, 2020 in International Application No. PCT/JP2020/013168; with partial English translation.

Junghwan Son et al., "A Highly Efficient Asymmetric Doherty Power Amplifier with a New Output Combining Circuit", 2011 IEEE, Reprinted from 2011 IEEE COMCAS, Tel Aviv, Israel, Nov. 7-9.

* cited by examiner (a)

(b)

MONOLITHIC SEMICONDUCTOR DEVICE AND HYBRID SEMICONDUCTOR DEVICE

CROSS REFERENCE TO RELATED APPLICATIONS

This is a continuation application of PCT International Application No. PCT/JP2020/013168 filed on Mar. 24, 2020, designating the United States of America, which is based on and claims priority of U.S. Provisional Patent Application No. 62/827,622 filed on Apr. 1, 2019. The entire disclosures of the above-identified applications, including the specifications, drawings and claims are incorporated herein by reference in their entirety.

FIELD

The present disclosure relates to monolithic semiconductor devices and hybrid semiconductor devices.

BACKGROUND

A high-electron-mobility transistor (HEMT) including a nitride semiconductor such as gallium nitride (GaN) has a power density 10 or more times higher than a power density of a HEMT including a gallium arsenide semiconductor. For this reason, an amplifier circuit that includes, as a high power device, an HEMT including a nitride semiconductor has been proposed (e.g., see Patent Literature (PTL) 1).

CITATION LIST

Patent Literature

PTL 1: Japanese Unexamined Patent Application Publication No. 2015-23098

SUMMARY

Technical Problem

In the technique of PTL 1, however, since a manufacturing variation (i.e., individual differences) in threshold voltage of transistors included in amplifier circuits are not considered, drain current (i.e., idle current) that flows through a transistor in an output stage when there is no signal differs for each manufactured amplifier circuit. Idle current changes power gain, distortion, efficiency, etc., and there is a trade-off between them. For this reason, it is necessary to keep idle current within a certain range in order to achieve a desired performance. Although idle current of an amplifier circuit is adjusted with gate voltage of transistors, it is difficult to keep the idle current within an acceptable range using a certain gate voltage due to a variation in individual transistors, and it is necessary to adjust the gate voltages individually.

In view of the above, the present disclosure has an object to provide a monolithic semiconductor device and a hybrid semiconductor device that include a transistor capable of reducing a workload for adjusting gate voltages individually.

Solution to Problem

In order to achieve the above object, a monolithic semiconductor device according to one aspect of the present disclosure includes: a substrate; a first nitride semiconductor layer disposed on the substrate; a second nitride semiconductor layer disposed on the first nitride semiconductor layer and having a band gap larger than a band gap of the first nitride semiconductor layer; a first transistor disposed on the substrate and including the first nitride semiconductor layer and the second nitride semiconductor layer, the first transistor being of a high-electron-mobility transistor (HEMT) type for power amplification; and a first bias circuit disposed on the substrate and including a second transistor of the HEMT type disposed outside a propagation path of a radio-frequency signal inputted to the first transistor, the first bias circuit applying bias voltage to a gate of the first transistor.

Moreover, in order to achieve the above object, a hybrid semiconductor device according to one aspect of the present disclosure includes: the first monolithic semiconductor device described above; and a second monolithic semiconductor device that is different from the first monolithic semiconductor device and includes a resistance element. The resistance element is used as part of the first bias circuit.

Advantageous Effects

A monolithic semiconductor device and a hybrid semiconductor device according to the present disclosure reduce a workload for adjusting gate voltages individually.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, nitride semiconductor devices according to embodiments will be described in detail with reference to the drawings. It should be noted that each of the embodiments described below shows a specific example of the present disclosure. The numerical values, shapes, materials, constituent elements, the arrangement and connection of the constituent elements, etc. shown in the following embodiments are mere examples, and are not intended to limit the scope of the present disclosure. Moreover, the figures are not necessarily precise illustrations. In the figures, substantially same elements are assigned the same reference signs, and overlapping description may be omitted or simplified. The expression "on an object" such as "on a substrate" includes both a case of being in contact with the object and a case of not being in contact with the object.

Embodiment 1

To begin with, a monolithic semiconductor device according to Embodiment 1 will be described.

Figure 1:
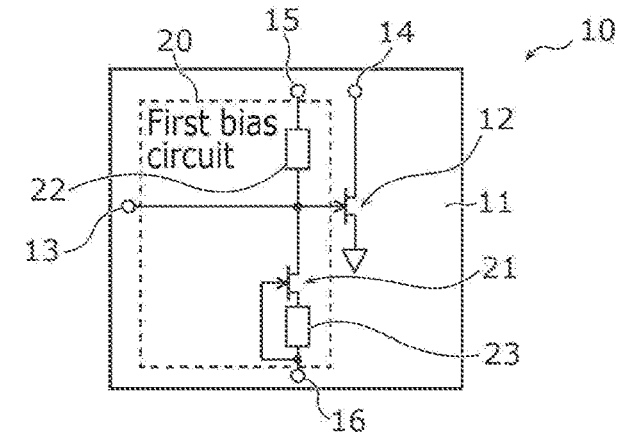
FIG. 1 is a diagram illustrating a monolithic semiconductor device according to Embodiment 1.
Figure 1:
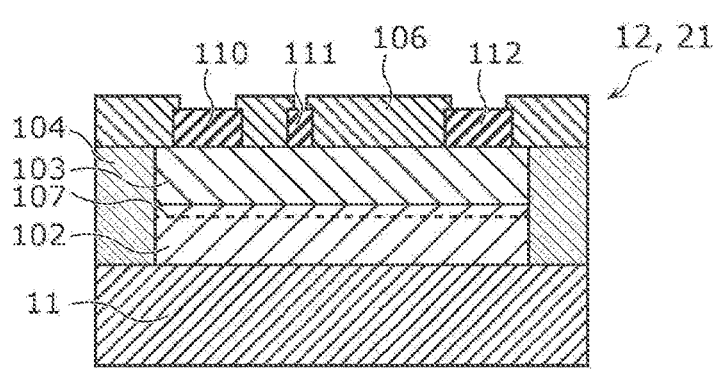
Figure 1:
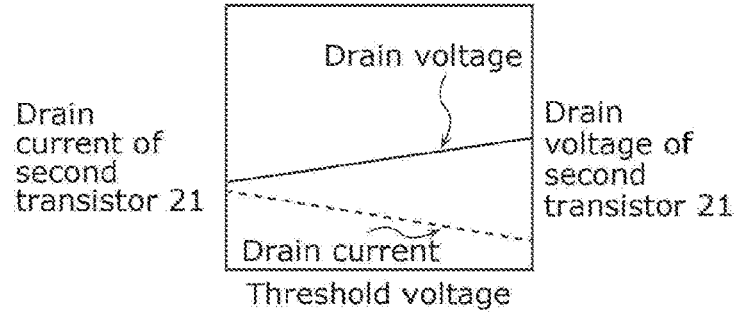
Figure 1:
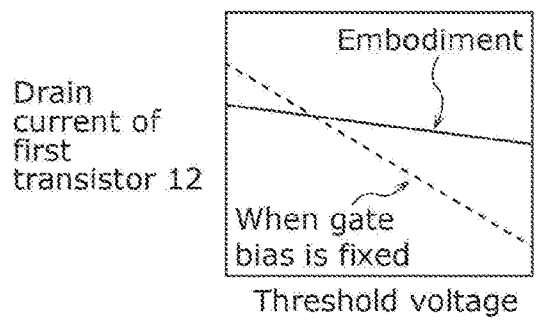

FIG. 1 is a diagram illustrating monolithic semiconductor device 10 according to Embodiment 1. More specifically, (a) in FIG. 1 is a circuit diagram of monolithic semiconductor device 10. (b) in FIG. 1 is a diagram illustrating a cross section structure of first transistor 12 and second transistor 21 shown by (a) in FIG. 1. (c) in FIG. 1 is a characteristic graph (i) whose horizontal axis indicates a threshold voltage (i.e., a variation in threshold voltage) of second transistor 21, left vertical axis indicates a drain current (the broken line) (i.e., idle current) of second transistor 21 when there is no signal, and right vertical axis indicates a drain voltage (the solid line) of second transistor 21 and (ii) that shows a threshold voltage dependence of second transistor 21. (d) in FIG. 1 is a characteristic graph (i) whose horizontal axis indicates a threshold voltage (i.e., a variation in threshold voltage) of first transistor 12 and vertical axis indicates a drain current (the solid line) (i.e., idle current) of first transistor 12 when there is no signal and (ii) that shows a threshold voltage dependence of first transistor 12. It should be noted that (d) in FIG. 1 also shows, for reference sake, a threshold voltage dependence (the broken line) obtained when a gate bias of first transistor 12 is fixed without connecting first bias circuit 20.

Monolithic semiconductor device 10 is a one-chip semiconductor device and includes: substrate 11 that is a semiconductor; first transistor 12 of a high-electron-mobility transistor (HEMT) type for power amplification that is disposed on substrate 11; second transistor 21 of the HEMT type that is disposed on substrate 11; and first bias circuit 20 that applies bias voltage to the gate of first transistor 12.

First bias circuit 20 includes first resistor 22, second transistor 21, and second resistor 23 that are connected in series. A connecting point between first resistor 22 and the drain of second transistor 21 is equivalent to a bias voltage output node of first bias circuit 20, and is connected to the gate of first transistor 12. Second transistor 21 is disposed outside a propagation path of radio-frequency signals inputted to first transistor 12. Second resistor 23 has one end connected to the source of second transistor 21 and another end connected to the gate of second transistor 21. It should be noted that the propagation path of the radio-frequency signals is a path through which a large part of radio-frequency signals inputted to gate terminal 13 is propagated.

Moreover, monolithic semiconductor device 10 has gate terminal 13 connected to the gate of first transistor 12, drain terminal 14 connected to the drain of first transistor 12, first bias terminal 15 connected to one end of first resistor 22, and second bias terminal 16 connected to the other end of second resistor 23. It should be noted that the source of first transistor 12 is connected to ground. Moreover, a higher voltage is applied to first bias terminal 15 than to second bias terminal 16. One of first bias terminal 15 and second bias terminal 16 may be connected to ground.

As shown by (b) in FIG. 1, first nitride semiconductor layer 102 including GaN etc. is disposed on substrate 11 including Si etc., second nitride semiconductor layer 103 including AlGaN etc. and having a band gap higher than a band gap of first nitride semiconductor layer 102 is disposed on first nitride semiconductor layer 102, and drain electrode 110, gate electrode 111, and source electrode 112 isolated by insulating layer 106 including SiN etc. are disposed on second nitride semiconductor layer 103. It should be noted that two-dimensional electron gas layer 107 is disposed in an interface between first nitride semiconductor layer 102 and second nitride semiconductor layer 103. In addition, isolation layer 104 for insulating first nitride semiconductor layer 102 and second nitride semiconductor layer 103 from the other circuit elements is disposed on substrate 11.

Gate electrode 111 is connected to second nitride semiconductor layer 103 by a Schottky barrier junction, and drain electrode 110 and source electrode 112 are in ohmic contact with two-dimensional electron gas layer 107 serving as a channel, after heat treatment etc. is performed on drain electrode 110 and source electrode 112. As stated above, first transistor 12 and second transistor 21 are each a HEMT-type transistor that is disposed on substrate 11 and includes first nitride semiconductor layer 102 and second nitride semiconductor layer 103.

In monolithic semiconductor device 10 according to the present embodiment thus configured, when a radio-frequency signal is inputted to gate terminal 13 in a state in which an appropriate bias voltage is applied to each of first bias terminal 15 and second bias terminal 16, power amplification is performed using first transistor 12 as a high-power device, and an output signal obtained as a result of the power amplification is outputted from drain terminal 14.

Generally speaking, a drain current of a transistor changes due to a difference between a threshold voltage and a gate bias, and when the gate bias is fixed, the drain current changes significantly due to a change in threshold voltage caused by a manufacturing variation. For example, the drain current decreases with an increase in the threshold voltage.

Here, it is assumed that a threshold voltage of first transistor 12 varies to be higher. In the present embodiment, a threshold voltage of second transistor 21 having the same structure as first transistor 12 on same substrate 11 also varies to be higher. Since second transistor 21 and second resistor 23 constitute a constant current source circuit, a drain current (i.e., an idle current) of second transistor 21 decreases with an increase in a threshold voltage of second transistor 21 ((c) in FIG. 1), and an amount of voltage drop caused by the drain current of second transistor 21 and first resistor 22 is reduced. As a result, since a gate voltage of first transistor 12 increases, a gate bias of first transistor 12 increases with an increase in threshold voltage of first transistor 12. With this, compared to a case in which a gate bias is fixed, the drain current (i.e., the idle current) of first transistor 12 is suppressed from decreasing ((d) in FIG. 1). Thus, according to the present embodiment, first bias circuit 20 that changes the gate voltage of first transistor 12 in accordance with the variation in threshold voltage makes it possible to keep an idle current within an acceptable range regardless of the presence of a constant voltage source, which reduces a workload for adjusting gate voltages individually.

Embodiment 2

Next, a hybrid semiconductor device according to Embodiment 2 will be described.

Figure 2:
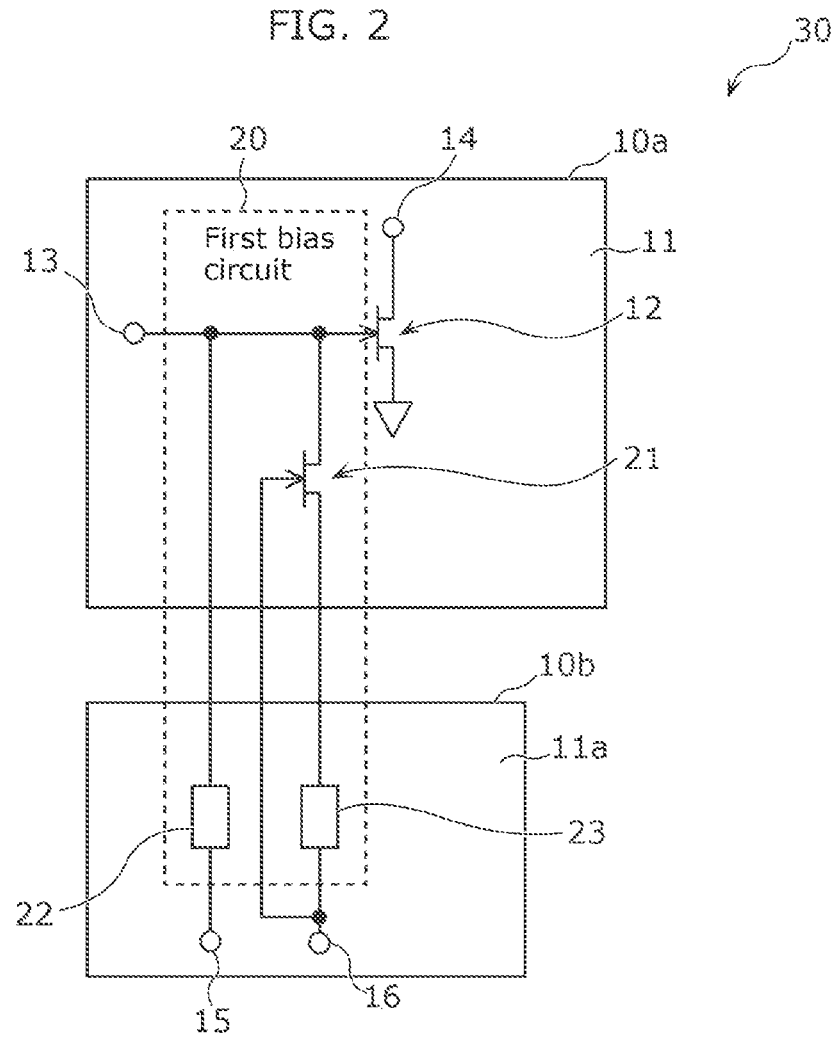
FIG. 2 is a circuit diagram of a hybrid semiconductor device according to Embodiment 2.

FIG. 2 is a circuit diagram of hybrid semiconductor device 30 according to Embodiment 2. Hybrid semiconductor device 30 basically has the same circuit configuration as monolithic semiconductor device 10 according to Embodiment 1, but differs from Embodiment 1 in including two separate substrates 11 and 11a (i.e., including a two-chip semiconductor device).

In other words, hybrid semiconductor device 30 includes, as circuit elements, first transistor 12, second transistor 21, first resistor 22, second resistor 23, gate terminal 13, drain terminal 14, first bias terminal 15, and second bias terminal 16, in addition to two substrates 11 and 11a. Among these circuit elements, first transistor 12, second transistor 21, gate terminal 13, and drain terminal 14 are disposed on substrate 11, and first resistor 22, second resistor 23, first bias terminal 15, and second bias terminal 16 are disposed on substrate 11a.

A monolithic semiconductor device formed using substrate 11 can be referred to as first monolithic semiconductor device 10a, and a monolithic semiconductor device formed using substrate 11a can be referred to as second monolithic semiconductor device 10b. Hybrid semiconductor device 30 includes first monolithic semiconductor device 10a and second monolithic semiconductor device 10b. It should be noted that first monolithic semiconductor device 10a and second monolithic semiconductor device 10b are connected via wire or a wiring pattern disposed on a submount substrate not shown.

Hybrid semiconductor device 30 according to the present embodiment thus configured produces the following advantageous effects due to the circuit formation using two separate substrates 11 and 11a, in addition to the advantageous effects of Embodiment 1. To put it another way, a transistor for signal amplification such as first transistor 12 may generate heat due to operating current, and heat up other circuit elements. Since, unlike first transistor 12, first resistor 22 and second resistor 23 are disposed on substrate 11a in hybrid semiconductor device 30 according to the present embodiment, the influence of the heat generated by first transistor 12 is reduced, and the stable operation of hybrid semiconductor device 30 is ensured.

Embodiment 3

Next, specific structures of first resistor 22 and second resistor 23 of second monolithic semiconductor device 10b according to Embodiment 2 will be described as Embodiment 3.

Figure 3:
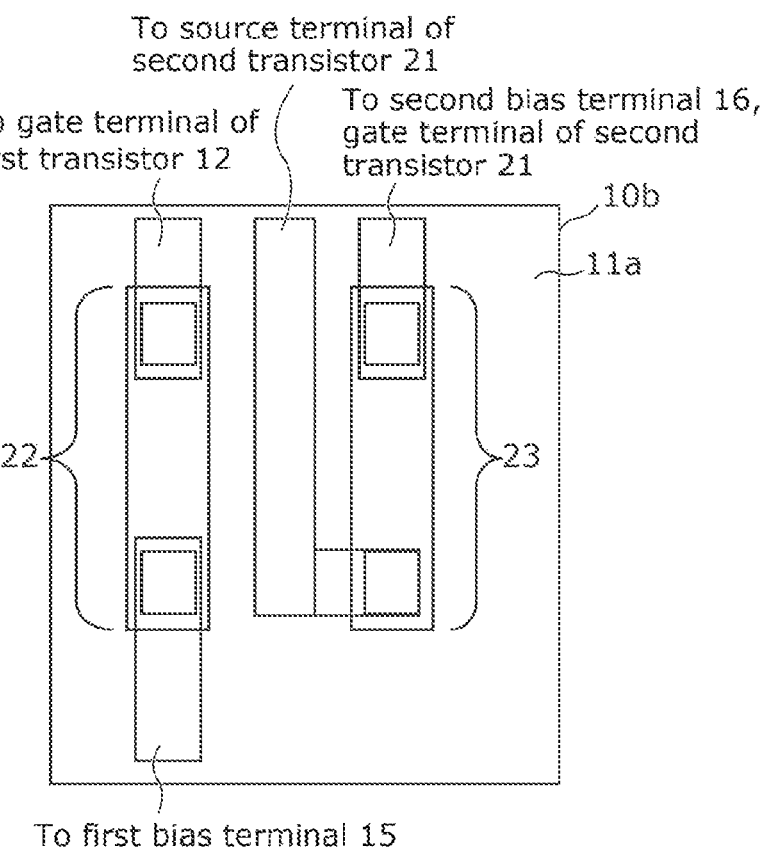
FIG. 3 is a diagram illustrating a first resistor and a second resistor according to Embodiment 3.
Figure 3:
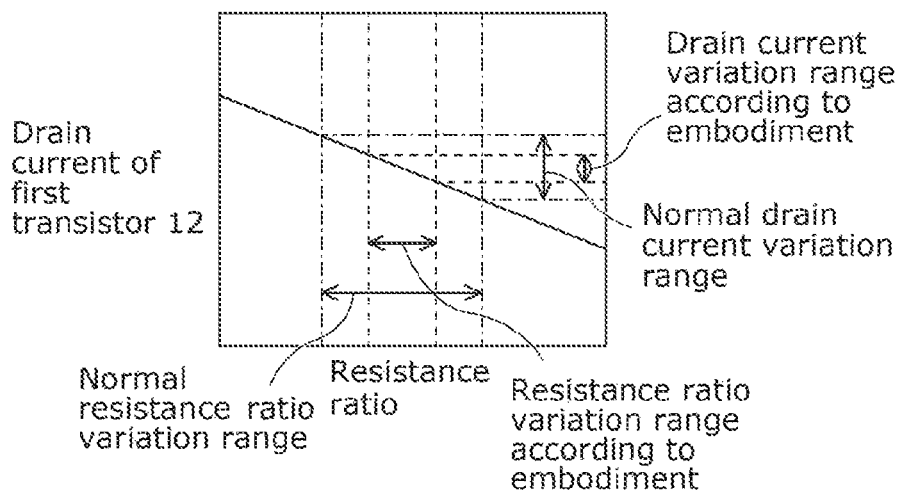

FIG. 3 is a diagram illustrating first resistor 22 and second resistor 23 according to Embodiment 3. More specifically, (a) in FIG. 3 shows a plan layout of first resistor 22 and second resistor 23. (b) in FIG. 3 shows a drain current of first transistor 12 according to Embodiment 2 including such first resistor 22 and second resistor 23. In (b) in FIG. 3, the horizontal axis indicates a value (a resistance ratio) obtained by dividing a resistance value of first resistor 22 by a resistance value of second resistor 23, and the vertical axis indicates the drain current of first transistor 12. It should be noted that (b) in FIG. 3 also shows, for reference sake, the value ranges in a normal case (a case in which the characteristics of the plan layout according to the present embodiment are not included), in addition to the value ranges in the present embodiment.

As shown by (a) in FIG. 3, first resistor 22 and second resistor 23 are disposed so that, in a plan view of second monolithic semiconductor device 10b, first resistor 22 and second resistor 23 are adjacent to each other without any other element interposed therebetween, and directions of current flowing in these resistors are identical.

A change in ratio between the resistance values of first resistor 22 and second resistor 23 leads to a change in gate voltage of first transistor 12, which results in a change in drain current of first transistor 12. In the present embodiment, however, as shown by (a) in FIG. 3, since first resistor 22 and second resistor 23 have the same structure, the same width (the same length of a direction orthogonal to a direction in which current flows), and the same current direction, the influence of the manufacturing variation on the resistance ratio between first resistor 22 and second resistor 23 is reduced. Consequently, as shown by (b) in FIG. 3, the variation in drain current of first transistor 12 according to Embodiment 2 including first resistor 22 and second resistor 23 having the same characteristics is reduced, compared to a case (a normal case) in which a configuration includes a first resistor and a second resistor not having the same characteristics.

Embodiment 4

Next, a monolithic semiconductor device according to Embodiment 4 will be described.

Figure 4:
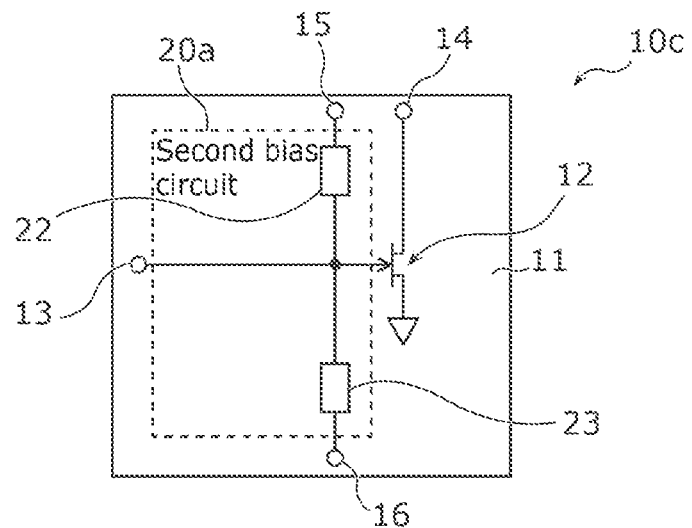
FIG. 4 is a diagram illustrating a monolithic semiconductor device according to Embodiment 4.
Figure 4:
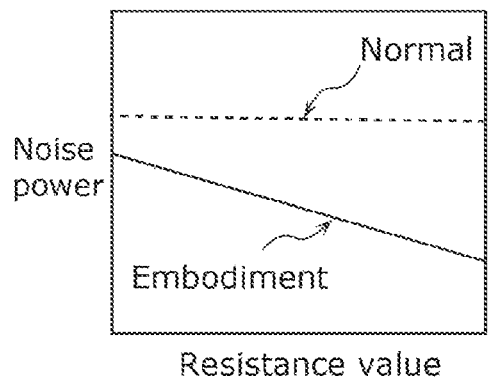

FIG. 4 is a diagram illustrating monolithic semiconductor device 10c according to Embodiment 4. More specifically, (a) in FIG. 4 is a circuit diagram of monolithic semiconductor device 10c. (b) in FIG. 4 shows dependence of noise power (the vertical axis) at the gate terminal of first transistor 12 when noise is applied to second bias terminal 16, on the resistance value (the horizontal axis) of second resistor 23. It should be noted that (b) in FIG. 4 also shows, for reference sake, normal noise power (the broken line) when second resistor 23 is absent (short-circuited).

As shown by (a) in FIG. 4, monolithic semiconductor device 10c includes substrate 11, first transistor 12 of the HEMT type for power amplification that is disposed on substrate 11, and second bias circuit 20a that applies bias voltage to the gate of first transistor 12. Second bias circuit 20a includes, as at least two resistance elements, first resistor 22 and second resistor 23 connected in series. Bias voltage is divided voltage generated by first resistor 22 and second resistor 23. It should be noted that Embodiment 4 is the same as Embodiment 1 in that first transistor 12 includes first nitride semiconductor layer 102 and second nitride semiconductor layer 103.

Since gate bias of first transistor 12, a transistor for signal amplification, is applied from the outside, noise may be superimposed on the gate bias. In the present embodiment, however, since the gate terminal of first transistor 12 is connected to the outside of substrate 11 via second resistor 23, external noise is attenuated by second resistor 23 and inputted to the gate terminal of first transistor 12. In consequence, as shown by (b) in FIG. 4, the influence of the external noise is reduced, compared to a case in which second resistor 23 is absent (short-circuited).

Embodiment 5

Next, specific structures of first resistor 22 and second resistor 23 of monolithic semiconductor device 10c according to Embodiment 4 will be described as Embodiment 5.

Figure 5:
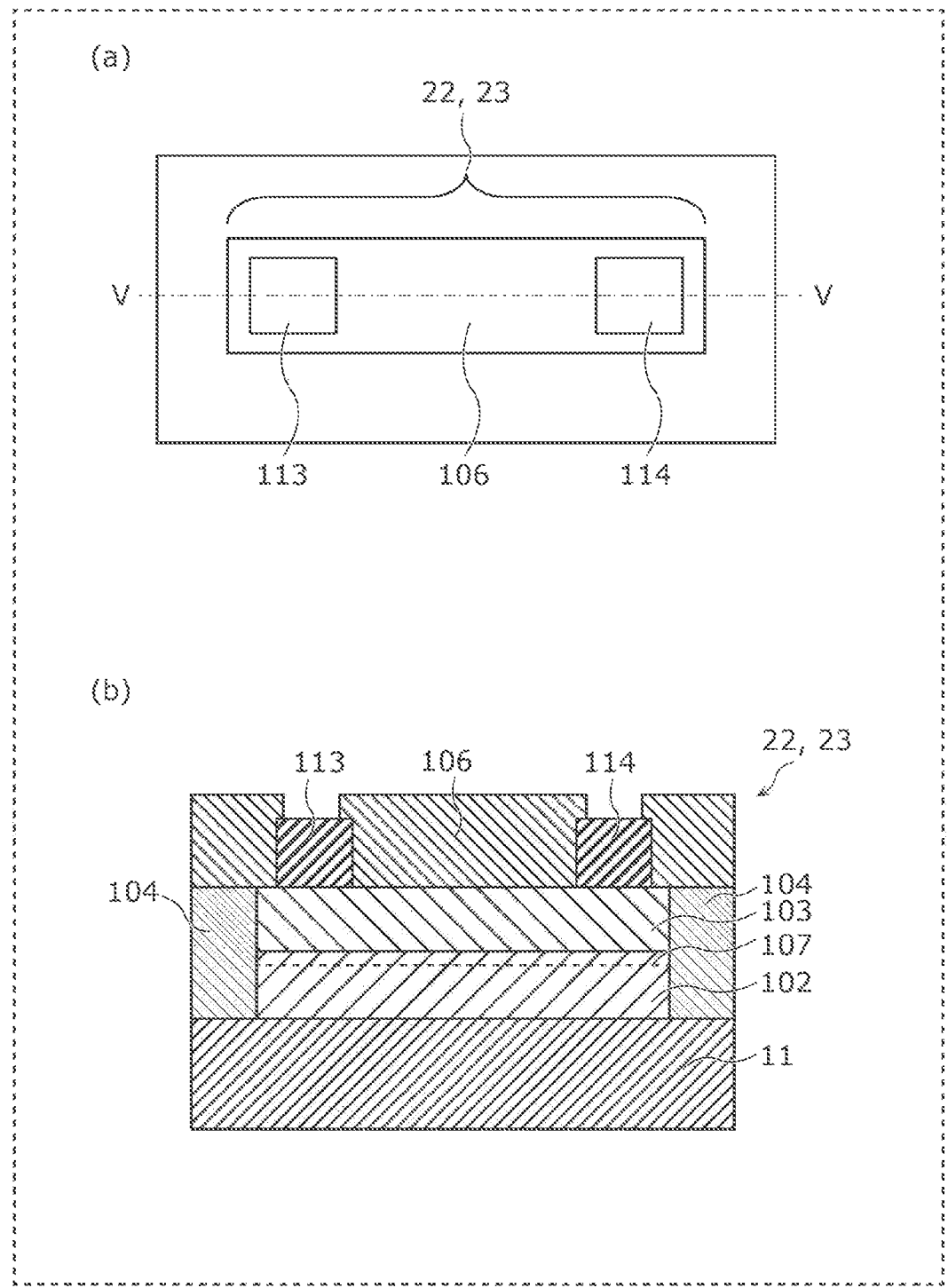
FIG. 5 is a structure diagram illustrating a first resistor and a second resistor according to Embodiment 5.

FIG. 5 is a structure diagram illustrating first resistor 22 and second resistor 23 according to Embodiment 5. More specifically, (a) in FIG. 5 shows a plan layout of first resistor 22 and second resistor 23, and (b) in FIG. 5 shows a cross section structure along line V-V in (a) in FIG. 5.

First nitride semiconductor layer 102 including GaN etc. is disposed on substrate 11. Second nitride semiconductor layer 103 including AlGaN etc. and having a band gap larger than a band gap of first nitride semiconductor layer 102 is disposed on first nitride semiconductor layer 102. First electrode 113 and second electrode 114 isolated by insulating layer 106 are disposed on second nitride semiconductor layer 103. It should be noted that two-dimensional electron gas layer 107 is disposed around (close to) an interface between first nitride semiconductor layer 102 and second nitride semiconductor layer 103. In addition, isolation layer 104 for insulating first nitride semiconductor layer 102 and second nitride semiconductor layer 103 from the other circuit elements is disposed on substrate 11. First electrode 113 and second electrode 114 are in ohmic contact with two-dimensional electron gas layer 107 serving as an electric-resistive element, after heat treatment etc. is performed on first electrode 113 and second electrode 114. First electrode 113 and second electrode 114 are configured as respective connection terminals of the electric-resistive element.

Since two-dimensional electron gas layer 107 serves as the electric-resistive element, first resistor 22 and second resistor 23 according to the present embodiment thus configured are characterized in that a resistance value increases at a high temperature. Accordingly, using first resistor 22 and second resistor 23 according to the present embodiment as resistance elements (first resistor 22 and second resistor 23) of second bias circuit 20a in monolithic semiconductor device 10c according to Embodiment 4 makes it possible to integrate resistors without adding steps, and a current flowing through second bias circuit 20a at a high temperature is reduced.

It should be noted that although first resistor 22 and second resistor 23 are each a resistance element including a two-dimensional electron gas layer as an electric-resistive element in the present embodiment, only one of the resistors may be the resistance element including the two-dimensional electron gas layer as the electric-resistive element, and the other of the resistors may be a normal resistance element such as a chip resistor.

Embodiment 6

Next, specific structures of first resistor 22 and second resistor 23 of monolithic semiconductor device 10c according to Embodiment 4 will be described as Embodiment 6.

Figure 6:
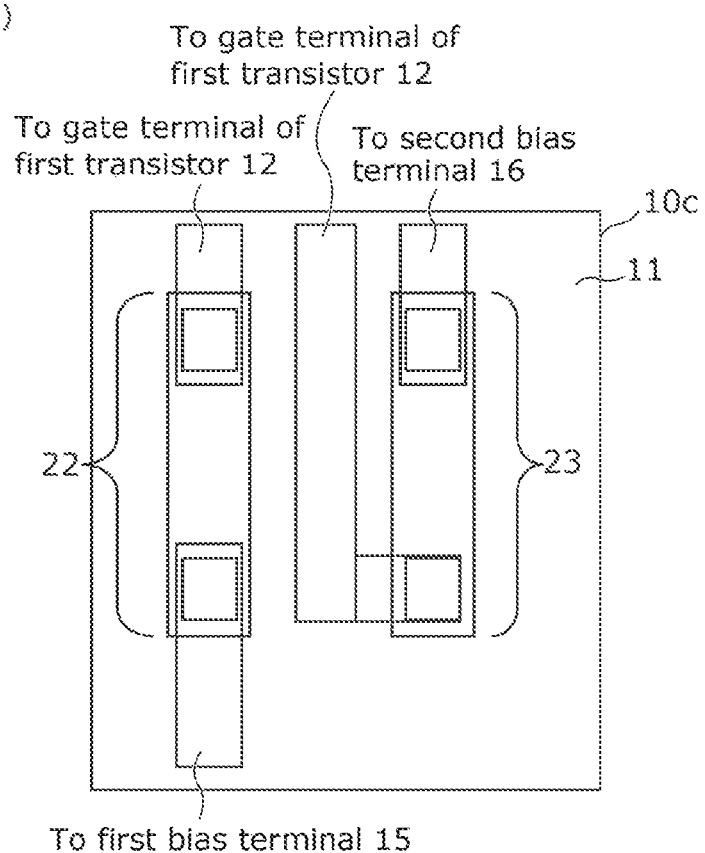
FIG. 6 is a diagram illustrating a first resistor and a second resistor according to Embodiment 6.
Figure 6:
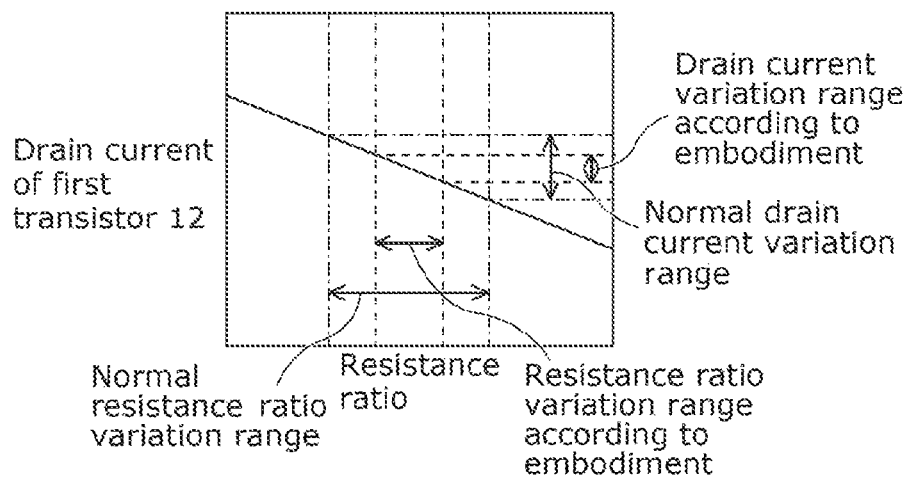

FIG. 6 is a diagram illustrating first resistor 22 and second resistor 23 according to Embodiment 6. More specifically, (a) in FIG. 6 shows a plan layout of first resistor 22 and second resistor 23, and (b) in FIG. 6 shows a drain current of first transistor 12 according to Embodiment 4 including first resistor 22 and second resistor 23. In (b) in FIG. 6, the horizontal axis indicates a value (a resistance ratio) obtained by dividing a resistance value of first resistor 22 by a resistance value of second resistor 23, and the vertical axis indicates the drain current of first transistor 12. It should be noted that (b) in FIG. 6 also shows, for reference sake, the value ranges in a normal case (a case in which the characteristics of the plan layout according to the present embodiment are not included), in addition to the value ranges in the present embodiment.

As shown by (a) in FIG. 6, first resistor 22 and second resistor 23 are disposed so that, in a plan view of monolithic semiconductor device 10c, first resistor 22 and second resistor 23 are adjacent to each other without any other element interposed therebetween, and directions of current flowing in these resistors are identical.

A change in ratio between the resistance values of first resistor 22 and second resistor 23 leads to a change in gate voltage of first transistor 12, which results in a change in drain current of first transistor 12. In the present embodiment, however, as shown by (a) in FIG. 6, since first resistor 22 and second resistor 23 have the same structure, the same width, and the same current direction, the influence of the manufacturing variation on the resistance ratio between first resistor 22 and second resistor 23 is reduced. Consequently, as shown by (b) in FIG. 6, the variation in drain current of first transistor 12 according to Embodiment 4 including first resistor 22 and second resistor 23 having the same characteristics is reduced, compared to a case (a normal case) in which a configuration includes a first resistor and a second resistor not having those characteristics.

Embodiment 7

Next, a monolithic semiconductor device according to Embodiment 7 will be described.

Figure 7:
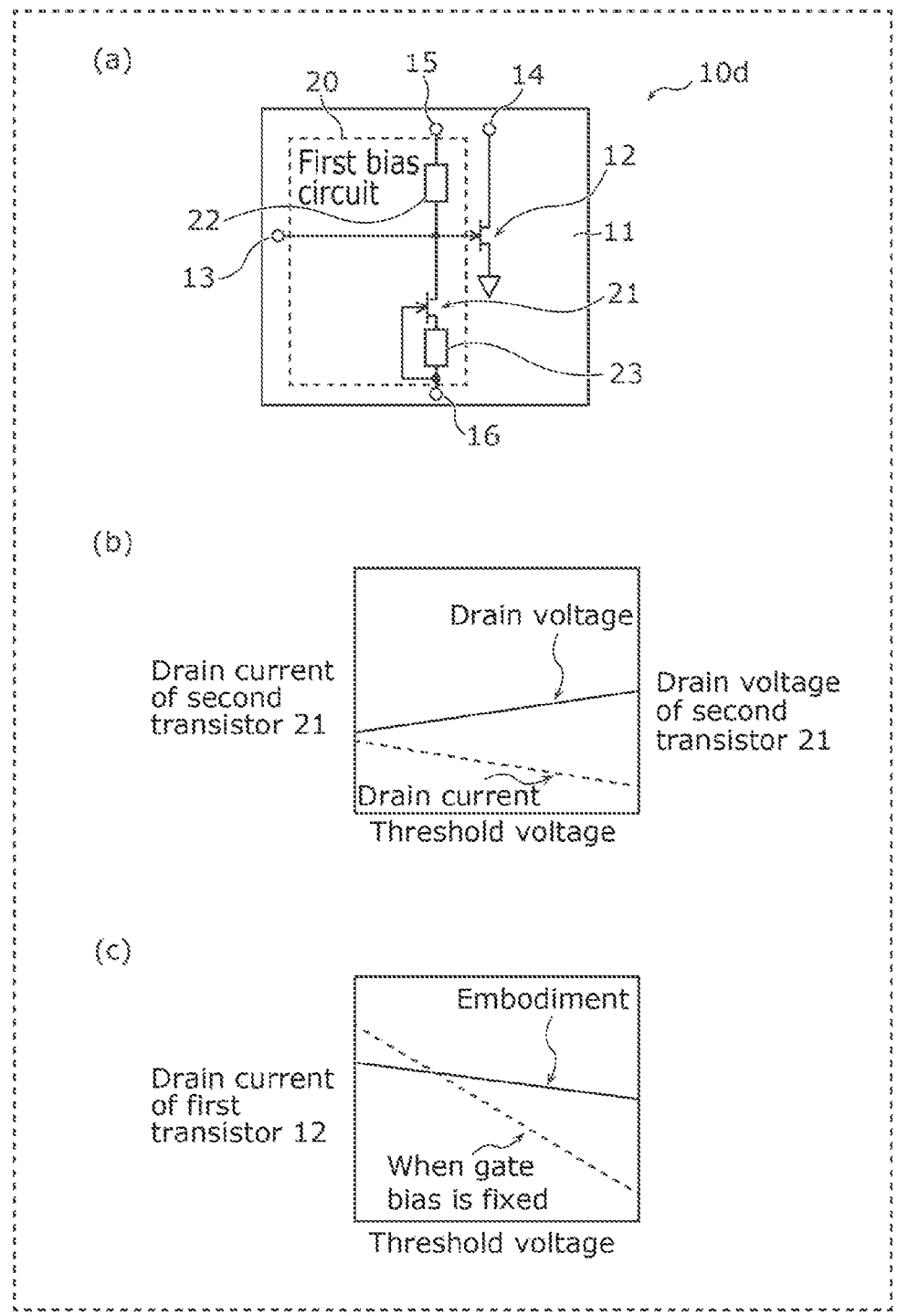
FIG. 7 is a diagram illustrating a monolithic semiconductor device according to Embodiment 7.

FIG. 7 is a diagram illustrating monolithic semiconductor device 10d according to Embodiment 7. More specifically, (a) in FIG. 7 is a circuit diagram of monolithic semiconductor device 10d. (b) in FIG. 7 is a characteristic graph (i) whose horizontal axis indicates a threshold voltage (i.e., a variation in threshold voltage) of second transistor 21, left vertical axis indicates a drain current (the broken line) (i.e., idle current) of second transistor 21 when there is no signal, and right vertical axis indicates a drain voltage (the solid line) of second transistor 21 and (ii) that shows a threshold voltage dependence of second transistor 21. (c) in FIG. 7 is a characteristic graph (i) whose horizontal axis indicates a threshold voltage (i.e., a variation in threshold voltage) of first transistor 12 and vertical axis indicates a drain current (the solid line) (i.e., idle current) of first transistor 12 when there is no signal and (ii) that shows a threshold voltage dependence of first transistor 12.

Monolithic semiconductor device 10d according to the present embodiment basically has the same circuit configuration as monolithic semiconductor device 10 according to Embodiment 1. In the present embodiment, first resistor 22 and second resistor 23 constituting first bias circuit 20 are each the resistance element including the two-dimensional electron gas layer as the electric-resistive element described in Embodiment 5, and are formed so that first resistor 22 and second resistor 23 have the same structure, the same width, and the same current direction as described in Embodiment 6. In this respect, the present embodiment differs from Embodiment 1 that is not limited to such resistance elements.

In monolithic semiconductor device 10d according to the present embodiment, when the threshold voltage of first transistor 12 varies to be higher, the threshold voltage of second transistor 21 having the same structure as first transistor 12 on same substrate 11 also varies to be higher. Since second transistor 21 and second resistor 23 constitute a constant current source circuit, as in Embodiment 1, the drain current of second transistor 21 decreases ((b) in FIG. 7) with an increase in the threshold voltage of second transistor 21, and an amount of voltage drop caused by the drain current of second transistor 21 and first resistor 22 is reduced. As a result, since a gate voltage of first transistor 12 increases, a gate bias of first transistor 12 increases with an increase in the threshold voltage of first transistor 12. With this, compared to a case in which a gate bias is fixed, the drain current (i.e., the idle current) of first transistor 12 is suppressed from decreasing ((c) in FIG. 7). Thus, according to the present embodiment, first bias circuit 20 that changes the gate voltage of first transistor 12 in accordance with the variation in threshold voltage makes it possible to keep an idle current within an acceptable range regardless of the presence of a constant voltage source, which reduces a workload for adjusting gate voltages individually.

Moreover, since first resistor 22 and second resistor 23 constituting first bias circuit 20 are each the resistance element in which the two-dimensional electron gas layer serves as an electric-resistive element and are characterized in that a resistance value increases at a high temperature, a current flowing through first bias circuit 20 at a high temperature is reduced.

Furthermore, since first resistor 22 and second resistor 23 have the same characteristics such as the same structure and the same current direction, a variation in the drain current of first transistor 12 is reduced, compared to a case in which first resistor 22 and second resistor 23 do not have the same characteristics.

Embodiment 8

Next, a monolithic semiconductor device according to Embodiment 8 will be described.

Figure 8:
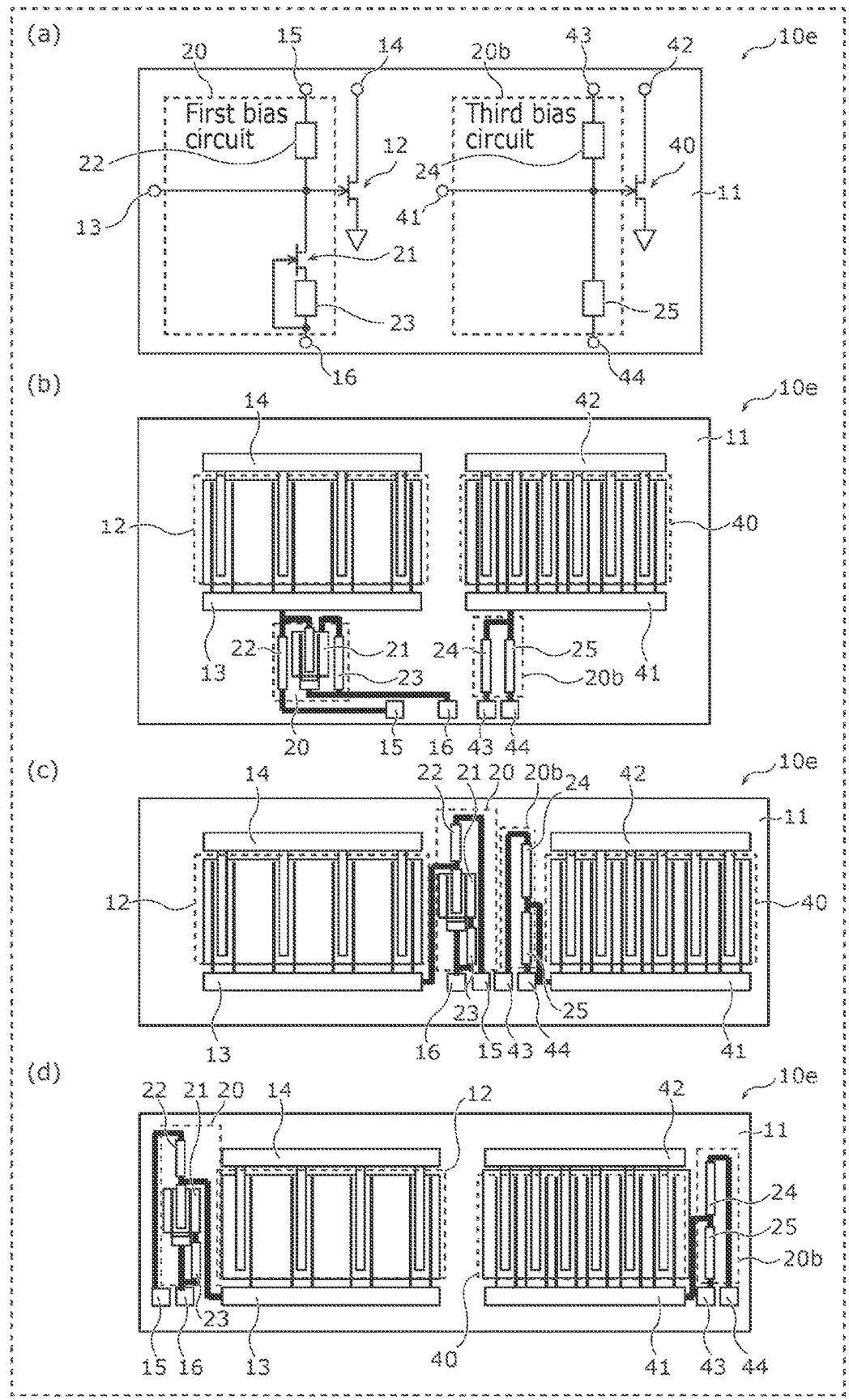
FIG. 8 is a diagram illustrating a monolithic semiconductor device according to Embodiment 8.

FIG. 8 is a diagram illustrating monolithic semiconductor device 10e according to Embodiment 8. More specifically, (a) in FIG. 8 is a circuit diagram of monolithic semiconductor device 10e, and (b) to (d) in FIG. 8 show examples of first to third plan layouts of monolithic semiconductor device 10e.

As shown by (a) in FIG. 8, monolithic semiconductor device 10e includes third transistor 40 of the HEMT type for power amplification disposed on substrate 11 and including first nitride semiconductor layer 102 and second nitride semiconductor layer 103, and third bias circuit 20b that applies bias voltage to the gate of third transistor 40, in addition to the configuration of monolithic semiconductor device 10 according to Embodiment 1.

Third bias circuit 20b includes third resistor 24 and fourth resistor 25 that are connected in series. A connecting point between third resistor 24 and fourth resistor 25 is equivalent to a bias voltage output node of third bias circuit 20b, and is connected to the gate of third transistor 40. It should be noted that third bias circuit 20b includes no HEMT-type transistor.

Moreover, monolithic semiconductor device 10e has gate terminal 41 connected to the gate of third transistor 40, drain terminal 42 connected to the drain of third transistor 40, third bias terminal 43 connected to one end of third resistor 24, and fourth bias terminal 44 connected to one end of fourth resistor 25, in addition to the terminals described in Embodiment 1. A higher voltage is applied to third bias terminal 43 than to fourth bias terminal 44. One of third bias terminal 43 and fourth bias terminal 44 may be connected to ground.

It should be noted that monolithic semiconductor device 10e constitutes a Doherty amplifier circuit including first transistor 12 as a carrier amplifier and third transistor 40 as a peak amplifier. A Doherty amplifier circuit is a radio-frequency amplifier that (i) has a configuration in which output of a B-class or AB-class amplifier operating continuously, referred to as a carrier amplifier, is directly coupled with output of a C-class amplifier operating only at the time of peak power, referred to as a peak amplifier, and (ii) has good efficiency even in a region where an output level is relatively low.

In the example of the first plan layout shown by (b) in FIG. 8, in order to reduce thermal and signal interference between first transistor 12 (the carrier amplifier) and third transistor 40 (the peak amplifier), a distance between the closest gates of the transistors is set to be at least twice as much as the thickness of substrate 11. (For example, when substrate 11 has a thickness of 100 μm, the distance is set to be at least 200 μm.) Moreover, in view of heat radiation by first transistor 12 (the carrier amplifier), the shortest distance between the gate of first transistor 12 (the carrier amplifier) and an end of substrate 11 is set to be greater than or equal to the thickness of substrate 11. (For example, when substrate 11 has a thickness of 100 μm, the shortest distance is set to be at least 100 μm.) It should be noted that in the present embodiment, first transistor 12 (the carrier amplifier) and third transistor 40 (the peak amplifier) are each a comb-shaped (i.e., multi-fingered) transistor.

First bias circuit 20 for first transistor 12 (the carrier amplifier) is disposed immediately below first transistor 12 (the carrier amplifier) in the plan layout, and second transistor 21 included in first bias circuit 20 is disposed close to the center of first transistor 12 (the carrier amplifier) in a direction in which the fingers of transistor 12 (the carrier amplifier) are arranged.

Since first transistor 12 (the carrier amplifier) and second transistor 21 included in first bias circuit 20 are disposed close to each other and in the same position in the direction in which the fingers are arranged, such a layout reduces the characteristic differences between the transistors.

In the example of the second plan layout shown by (c) in FIG. 8, in view of heat radiation by first transistor 12 (the carrier amplifier), the shortest distance between the gate of first transistor 12 (the carrier amplifier) and an end of substrate 11 is set to be greater than or equal to the thickness of substrate 11. (For example, when substrate 11 has a thickness of 100 µm, the shortest distance is set to be at least 100 µm.) Moreover, first bias circuit 20 for first transistor 12 (the carrier amplifier) is disposed between first transistor 12 (the carrier amplifier) and third transistor 40 (the peak amplifier), and second transistor 21 included in first bias circuit 20 is disposed in an area located in an extension of the direction in which the fingers of first transistor 12 (the carrier amplifier) are arranged.

It should be noted that a distance between the gates of first transistor 12 (the carrier amplifier) and second transistor 21 may be at most 50 µm. Moreover, bias resistors (third resistor 24, fourth resistor 25) for third transistor 40 (the peak amplifier) may be disposed at a distance of at most 50 µm from second transistor 21.

Disposing two bias circuits (first bias circuit 20, third bias circuit 20b) in a space between first transistor 12 (the carrier amplifier) and third transistor 40 (the peak amplifier) ensures that the shortest distance between the gates of first transistor 12 (the carrier amplifier) and third transistor 40 (the peak amplifier) is at least twice as much as the thickness of substrate 11, and reduces the thermal and signal interference between first transistor 12 (the carrier amplifier) and third transistor 40 (the peak amplifier).

Since the space between first transistor 12 (the carrier amplifier) and third transistor 40 (the peak amplifier) can be used for bias circuits, such a layout achieves a high area efficiency. In addition, since first transistor 12 (the carrier amplifier) and second transistor 21 included in first bias circuit 20 are disposed close to each other and in the same position in a direction orthogonal to the direction in which the fingers are arranged, the characteristic differences between the transistors are reduced.

In the example of the third plan layout shown by (d) in FIG. 8, in order to reduce thermal and signal interference between first transistor 12 (the carrier amplifier) and third transistor 40 (the peak amplifier), a distance between the closest gates of the transistors is set to be at least twice as much as the thickness of substrate 11. (For example, when substrate 11 has a thickness of 100 µm, the distance is set to be at least 200 µm.) Moreover, first bias circuit 20 for first transistor 12 (the carrier amplifier) is disposed between first transistor 12 (the carrier amplifier) and an end of substrate 11, and second transistor 21 included in first bias circuit 20 is disposed in an area located in an extension of the direction in which the fingers of first transistor 12 (the carrier amplifier) are arranged.

It should be noted that a distance between the gates of first transistor 12 (the carrier amplifier) and second transistor 21 may be at most 50 µm.

Since the space between first transistor 12 (the carrier amplifier) and the end of substrate 11 can be used for first bias circuit 20, such a layout achieves a high area efficiency. In addition, since first transistor 12 (the carrier amplifier) and second transistor 21 included in first bias circuit 20 are disposed close to each other and in the same position in a direction orthogonal to the direction in which the fingers are arranged, the characteristic differences between the transistors are reduced.

Generally speaking, in a Doherty amplifier circuit, since gate voltage that does not cause drain current to flow through a low power region is applied to a peak amplifier operating only at the time of peak power, the peak amplifier has a smaller characteristic fluctuation due to a variation in gate bias than a carrier amplifier operating continuously. In monolithic semiconductor device 10e according to the present embodiment, first bias circuit 20 including second transistor 21 is integrated as a bias circuit for first transistor 12 constituting the carrier amplifier influenced significantly by the variation in gate bias. This helps to achieve both a variation compensating effect of the carrier amplifier and a reduction of the chip size of the peak amplifier.

It should be noted that the numerical conditions described above, such as setting the distance between the closest gates of first transistor 12 and third transistor 40 to be twice as much as the thickness of substrate 11, are based on the experience of the inventors, and the present disclosure is not limited to those.

Embodiment 9

Next, an enable control circuit that can be added to the bias circuit according to Embodiments 1 to 8 will be described as Embodiment 9.

Figure 9:
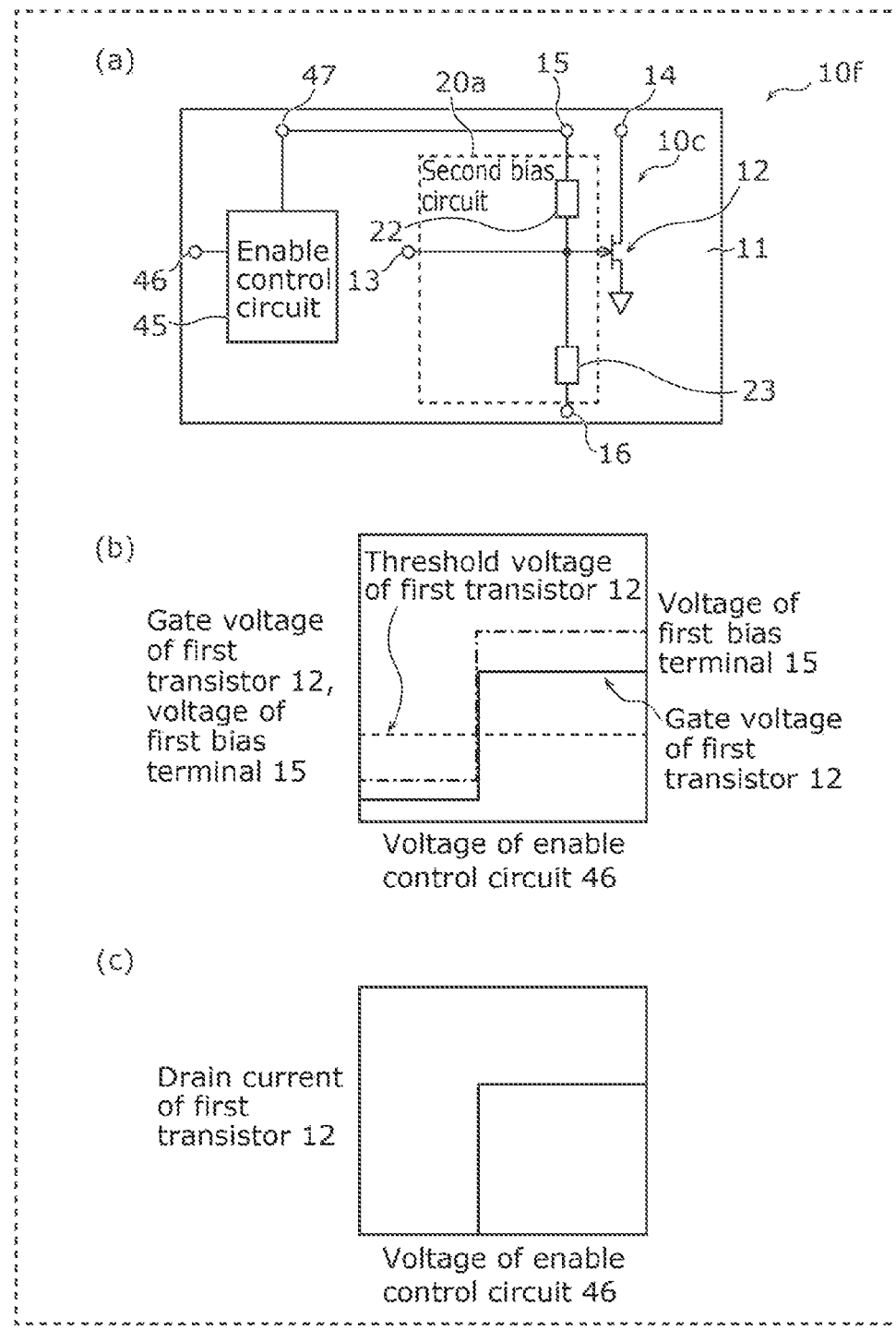
FIG. 9 is a diagram illustrating an enable control circuit according to Embodiment 9.

FIG. 9 is a diagram illustrating enable control circuit 45 according to Embodiment 9. More specifically, (a) in FIG. 9 is a circuit diagram of enable control circuit 45. Here, the circuit diagram shows a circuit example of monolithic semiconductor device 10f obtained by adding enable control circuit 45 to monolithic semiconductor device 10c according to Embodiment 4. (b) and (c) in FIG. 9 each show a voltage dependence of enable control terminal 46 shown by (a) in FIG. 9. In other words, (b) in FIG. 9 shows a relationship between a voltage (the horizontal axis) of enable control terminal 46 and a voltage (the vertical axis, the alternate long and short dash line) of first bias terminal 15 and a gate voltage (the vertical axis, the solid line) of first transistor 12. It should be noted that (b) in FIG. 9 also shows a threshold voltage (the broken line) of first transistor 12. (c) in FIG. 9 shows a relationship between a voltage (the horizontal axis) of enable control terminal 46 and a drain current (the vertical axis) of first transistor 12.

As shown by (a) in FIG. 9, enable control circuit 45 that controls an activation state of bias voltage applied to the gate of first transistor 12 is disposed on substrate 11 of monolithic semiconductor device 10f. Moreover, substrate 11 includes enable control terminal 46 that is an input terminal of enable control circuit 45, and enable output terminal 47 that is an output terminal of enable control circuit 45 and is connected to first bias terminal 15. It should be noted that a voltage lower than the threshold voltage of first transistor 12 is applied to second bias terminal 16.

Enable control circuit 45 is a circuit that includes a switch element etc. and selectively outputs via enable output terminal 47 a voltage lower than the threshold voltage of first transistor 12 and a voltage higher than the threshold voltage of first transistor 12 in response to a change in a voltage of at least 0 V (high voltage/low voltage) applied to enable control terminal 46.

When a low voltage is inputted to enable control terminal 46 of enable control circuit 45, a voltage lower than the threshold voltage of first transistor 12 is outputted from enable output terminal 47 and is applied to first bias terminal 15 ((b) in FIG. 9). As a result, a gate voltage of first transistor 12 becomes lower than the threshold voltage of first transistor 12, and first transistor 12 is put into an off state in which no drain current flows ((c) in FIG. 9).

On the other hand, when a high voltage is inputted to enable control terminal 46 of enable control circuit 45, a voltage higher than the threshold voltage of first transistor 12 is outputted from enable output terminal 47 and is applied to first bias terminal 15 ((b) in FIG. 9). The voltage applied to first bias terminal 15 is divided by first resistor 22 and second resistor 23 of second bias circuit 20a. Here, first resistor 22 and second resistor 23 are set so that the divided voltage becomes higher than the threshold voltage of first transistor 12. As a result, a gate voltage of first transistor 12 becomes higher than the threshold voltage of first transistor 12, and first transistor 12 is put into an on state in which drain current flows ((c) in FIG. 9).

Enable control circuit 45 according to the present embodiment thus configured is capable of switching first transistor 12 between the off state and the on state according to a voltage of at least 0 V applied to enable control terminal 46. Accordingly, compared to a case in which power supply voltage is applied fixedly to first bias terminal 15, when no amplifier operation is performed, it is possible to reduce the drain current easily, and the power consumption is reduced.

It should be noted that although the circuit example in which enable control circuit 45 is added to monolithic semiconductor device 10c according to Embodiment 4 has been described in the present embodiment, enable control circuit 45 may be added to the semiconductor device according to any one of Embodiments 1 to 8.

It should be noted that enable control circuit 45 may be disposed on a semiconductor substrate different from monolithic semiconductor device 10c or on a submount substrate, and may be connected to monolithic semiconductor device 10c via a wiring pattern, wire, etc.

Embodiment 10

Next, a hybrid semiconductor device according to Embodiment 10 will be described.

Figure 10:
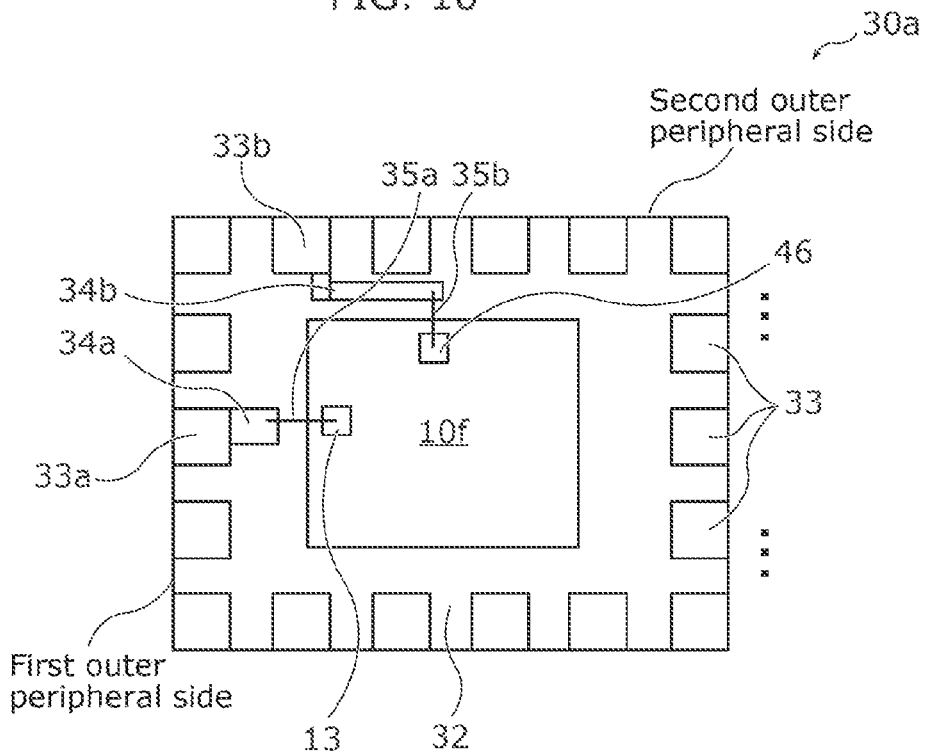
FIG. 10 is a plan layout diagram of a hybrid semiconductor device according to Embodiment 10.

FIG. 10 is a plan layout diagram of hybrid semiconductor device 30a according to Embodiment 10. Hybrid semiconductor device 30a includes submount substrate 32 that is quadrilateral in shape in a plan view and monolithic semiconductor device 10f according to Embodiment 9 mounted on submount substrate 32.

Submount substrate 32 is, for example, a resin or ceramic substrate and has the outer peripheral sides on which substrate terminals 33 are disposed. Substrate terminals 33 include radio-frequency signal input substrate terminal 33a and enable control input substrate terminal 33b. Radio-frequency signal input substrate terminal 33a is disposed on a first outer peripheral side among the four outer peripheral sides of submount substrate 32, and is connected to gate terminal 13 of monolithic semiconductor device 10f via wiring pattern 34a and wire 35a on submount substrate 32. Enable control input substrate terminal 33b is (i) disposed in a substrate terminal position other than a corner substrate terminal position on, among the four outer peripheral sides of submount substrate 32, a second outer peripheral side other than the first outer peripheral side on which radio-frequency signal input substrate terminal 33a is disposed, and (ii) connected to enable control terminal 46 of monolithic semiconductor device 10f via wiring pattern 34b and wire 35b on submount substrate 32.

Such a layout of hybrid semiconductor device 30a according to the present embodiment reduces interference by a signal inputted to radio-frequency signal input substrate terminal 33a and a signal inputted to enable control input substrate terminal 33b, and reduces (i) malfunction caused by an input signal inputted to radio-frequency signal input substrate terminal 33a leaking to enable control terminal 46 or (ii) deterioration of an input signal caused by noise inputted to enable control terminal 46 being inputted to radio-frequency signal input substrate terminal 33a.

Embodiment 11

Next, the following will describe, as Embodiment 11, a circuit that is applicable to, among the semiconductor devices according to Embodiments 1 to 10, a semiconductor device including a bias circuit including at least two transistors, reduces noise that may get mixed in from a bias terminal, and has an effect of reducing RF leakage to the bias circuit.

Figure 11:
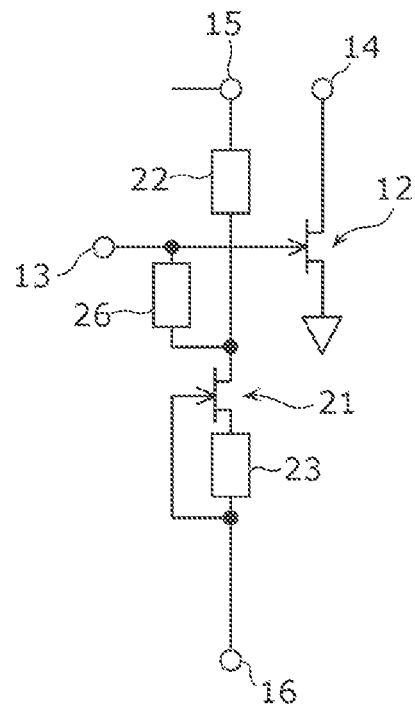
FIG. 11 is a circuit diagram of a noise reduction circuit according to Embodiment 11.

FIG. 11 is a circuit diagram of a noise reduction circuit according to Embodiment 11. Here, the circuit diagram shows a circuit example in which fifth resistor 26 is added as a noise reduction circuit to first bias circuit 20 according to Embodiment 1. Fifth resistor 26 is a resistance element connected between a bias voltage output node (i.e., a connecting point between first resistor 22 and the drain terminal of second transistor 21) of first bias circuit 20 and the gate of first transistor 12.

When noise is superimposed on second bias terminal 16, the noise is applied to gate terminal 13 of first transistor 12 via gate-drain capacitance of second transistor 21, and is amplified and outputted by first transistor 12. According to the present embodiment, since fifth resistor 26 is connected between the bias voltage output node of first bias circuit 20 and the gate of first transistor 12, noise that gets mixed in from second bias terminal 16 is attenuated by fifth resistor 26. As a result, the amount of noise inputted to gate terminal 13 of first transistor 12 is reduced.

Embodiment 12

Next, the following will describe, as Embodiment 12, another circuit that is applicable to, among the semiconductor devices according to Embodiments 1 to 10, a semiconductor device including a bias circuit including at least two transistors, and reduces noise that may get mixed in from a bias terminal.

Figure 12:
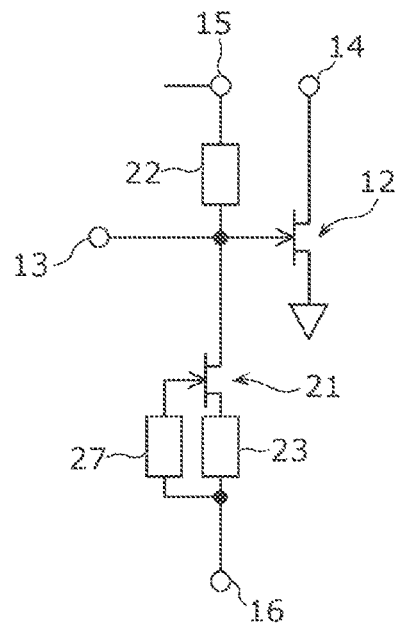
FIG. 12 is a circuit diagram of a noise reduction circuit according to Embodiment 12.

FIG. 12 is a circuit diagram of a noise reduction circuit according to Embodiment 12. Here, the circuit diagram shows a circuit example in which sixth resistor 27 is added as a noise reduction circuit to first bias circuit 20 according to Embodiment 1. Sixth resistor 27 is a resistance element connected between (i) second bias terminal 16 that supplies power supply voltage to first bias circuit 20 and (ii) the gate of second transistor 21.

When noise is superimposed on second bias terminal 16, the noise is applied to gate terminal 13 of first transistor 12 via gate-drain capacitance of second transistor 21, and is amplified and outputted by first transistor 12. According to the present embodiment, since sixth resistor 27 is connected between second bias terminal 16 and the gate of second transistor 21, noise that gets mixed in from second bias terminal 16 is attenuated by sixth resistor 27. As a result, the amount of noise inputted to gate terminal 13 of first transistor 12 is reduced.

Embodiment 13

Next, a monolithic semiconductor device according to Embodiment 13 will be described.

Figure 13:
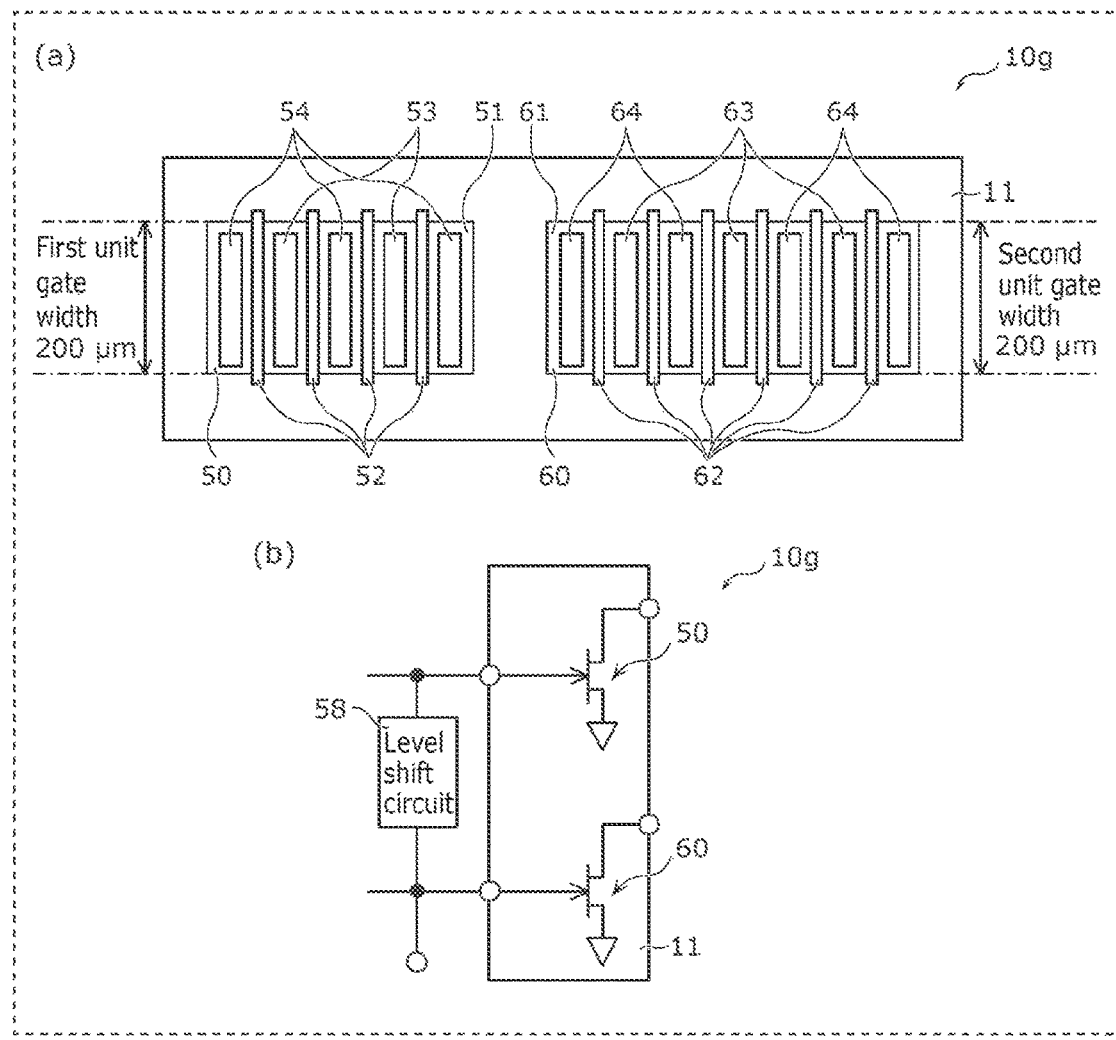
FIG. 13 is a diagram illustrating a monolithic semiconductor device according to Embodiment 13.

FIG. 13 is a diagram illustrating monolithic semiconductor device 10g according to Embodiment 13. More specifically, (a) in FIG. 13 is a plan layout diagram of monolithic semiconductor device 10g, and (b) in FIG. 13 is a circuit diagram of monolithic semiconductor device 10g used for a Doherty amplifier. Monolithic semiconductor device 10g includes substrate 11, first transistor 50 of the HEMT type for power amplification disposed on substrate 11, and second transistor 60 of the HEMT type for power amplification disposed on substrate 11 and having a conduction current capacity greater than a conduction current capacity of first transistor 50. Monolithic semiconductor device 10g is used for a Doherty amplifier circuit including first transistor 50 as a carrier amplifier and second transistor 60 as a peak amplifier.

It should be noted that a cross section structure of first transistor 50 and second transistor 60 is the same as the structure shown by (b) in FIG. 1. To put it another way, first nitride semiconductor layer 102 including GaN etc. is disposed on substrate 11. Second nitride semiconductor layer 103 including AlGaN etc. and having a band gap larger than a band gap of first nitride semiconductor layer 102 is disposed on first nitride semiconductor layer 102. Drain electrode 110, gate electrode 111, and source electrode 112 isolated by insulating layer 106 including SiN etc. are disposed on second nitride semiconductor layer 103.

Two-dimensional electron gas layer 107 is disposed in an interface between first nitride semiconductor layer 102 and second nitride semiconductor layer 103. First transistor 50 and second transistor 60 are each a HEMT-type transistor disposed on substrate 11 and including first nitride semiconductor layer 102 and second nitride semiconductor layer 103.

As shown by (a) in FIG. 13, first transistor 50 comprises four parallel-connected unit transistors disposed in continuous first active region 51, and includes four gate electrodes 52, two drain electrodes 53, and three source electrodes 54. Second transistor 60 comprises six parallel-connected unit transistors disposed in continuous second active region 61, and includes six gate electrodes 62, three drain electrodes 63, and four source electrodes 64.

Here, a gate electrode width per gate electrode of first transistor 50 is referred to as a first unit gate electrode width (200 μm in this example), a gate electrode width per gate electrode of second transistor 60 is referred to as a second unit gate electrode width (200 μm in this example), a gate electrode count of first transistor 50 is referred to as a first gate electrode count (4 in this example), and a gate electrode count of second transistor 60 is referred to as a second gate electrode count (6 in this example). Monolithic semiconductor device 10g is configured so that a value (1200) obtained by multiplying the second unit gate electrode width and the second gate electrode count is larger than a value (800) obtained by multiplying the first unit gate electrode width and the first gate electrode count. Such a configuration allows the conduction current capacity of second transistor 60 to be greater than the conduction current capacity of first transistor 50.

It is known that, regarding PAPR that is a ratio between peak power and average power of a modulating signal in a Doherty amplifier circuit, when a conduction current capacity of a carrier amplifier of the Doherty amplifier circuit is equal to a conduction current capacity of a peak amplifier of the Doherty amplifier circuit, the highest efficiency is achieved at PAPR=6 dB.

According to monolithic semiconductor device 10g according to the present embodiment, since the conduction current capacity of second transistor 60 that is the peak amplifier is greater than the conduction current capacity of first transistor 50 that is the carrier amplifier, the Doherty amplifier circuit that performs signal amplification in which the PAPR is greater than 6 dB and has a higher efficiency is achieved.

First transistor 50 (the carrier amplifier) operates by a gate voltage higher than a gate voltage of second transistor 60 (the peak amplifier) being applied to first transistor 50. It is usually necessary to adjust gate voltages of first transistor 50 (the carrier amplifier) and second transistor 60 (the peak amplifier) individually. In the present embodiment, however, since the both transistors are disposed on substrate 11, threshold voltages of the transistors are substantially equal, and as shown by (b) in FIG. 13, for example, by connecting the gate terminals of the transistors via level shift circuit 58, one gate voltage adjustment makes it possible to determine the gate voltages of both first transistor 50 (the carrier amplifier) and second transistor 60 (the peak amplifier), which enables a reduction of a workload for adjusting gate voltages to half.

Embodiment 14

Next, the following will describe, as Embodiment 14, a monolithic semiconductor device in which the second transistor has a conduction current capacity that is at least 1.5 times and at most 1.7 times as much as a conduction current capacity of the first transistor described in Embodiment 13.

Figure 14:
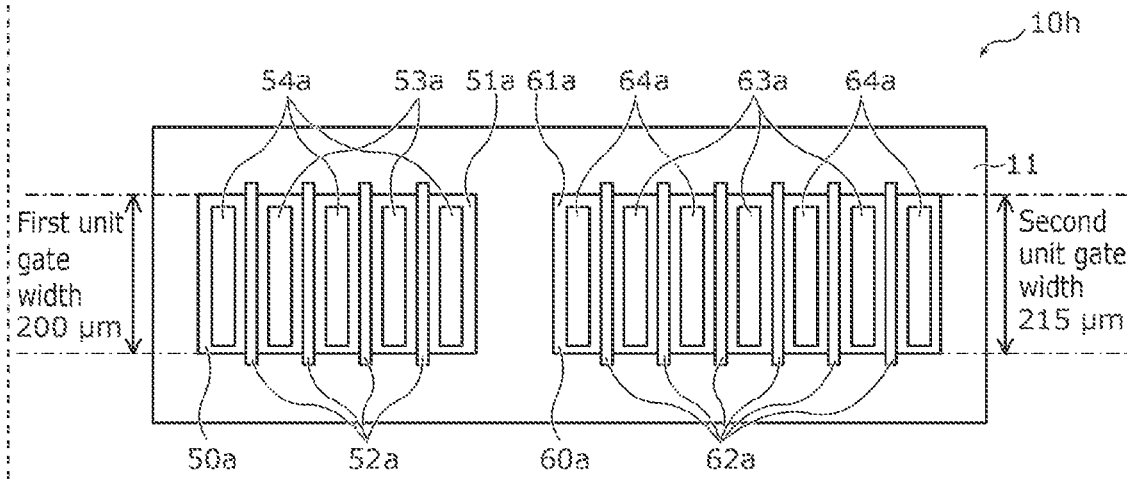
FIG. 14 is a diagram illustrating a monolithic semiconductor device according to Embodiment 14.
Figure 14:
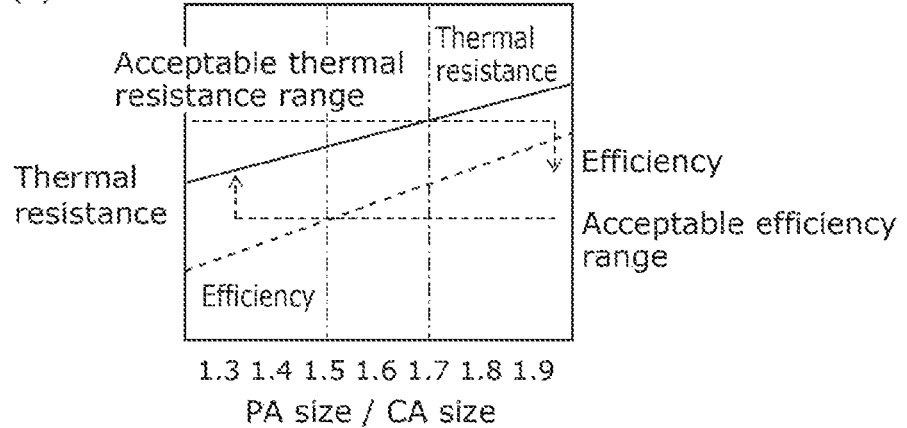
Figure 14:
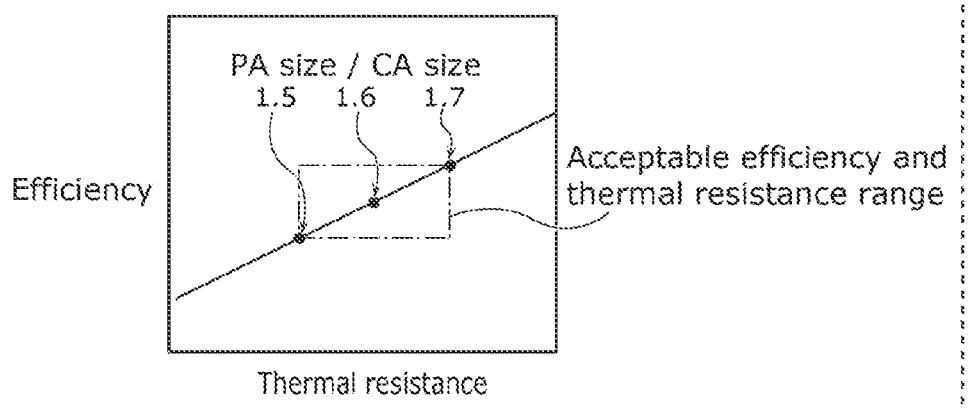

FIG. 14 is a diagram illustrating monolithic semiconductor device 10h according to Embodiment 14. More specifically, (a) in FIG. 14 is a plan layout diagram of monolithic semiconductor device 10h. (b) in FIG. 14 is a graph showing a relationship between (i) a ratio (PA size/CA size, the horizontal axis) between sizes of a peak amplifier (second transistor 60a) and a carrier amplifier (first transistor 50a) of monolithic semiconductor device 10h and (ii) a thermal resistance (the solid line, the left vertical axis) and efficiency (the broken line, the right vertical axis). (c) in FIG. 14 is a graph showing a relationship between the thermal resistance (the horizontal axis) and efficiency (the vertical axis) of monolithic semiconductor device 10h. Here, the sizes of the peak amplifier and the carrier amplifier are each a value obtained by multiplying a unit gate electrode width and a gate electrode count.

As in Embodiment 13, monolithic semiconductor device 10h according to the present embodiment is used for a Doherty amplifier circuit including first transistor 50a as a carrier amplifier and second transistor 60a as a peak amplifier.

As shown by (a) in FIG. 14, first transistor 50a comprises four parallel-connected unit transistors disposed in continuous first active region 51a, and includes four gate electrodes 52a, two drain electrodes 53a, and three source electrodes 54a. Second transistor 60a comprises six parallel-connected unit transistors disposed in continuous second active region 61a, and includes six gate electrodes 62a, three drain electrodes 63a, and four source electrodes 64a.

Here, first transistor 50a has a first unit gate electrode width of 200 μm that is a gate electrode width per gate electrode of first transistor 50a, and second transistor 60a has a second unit gate electrode width of 215 μm that is a gate electrode width per gate electrode of second transistor 60a. Accordingly, in the present embodiment, monolithic semiconductor device 10h is configured so that a value (1290) obtained by multiplying the second unit gate electrode width (215 μm) and the second gate electrode count (6)

is at least 1.5 times and at most 1.7 times as much as a value (800) obtained by multiplying the first unit gate electrode width (200 µm) and the first gate electrode count (4). Such a configuration allows the conduction current capacity of second transistor 60a to be at least 1.5 times and at most 1.7 times as much as the conduction current capacity of first transistor 50a.

Generally speaking, since a radio-frequency amplifier circuit achieves a high efficiency when the radio-frequency amplifier circuit operates with a power close to a saturation power, downsizing the carrier amplifier (first transistor 50a) operating continuously in the Doherty amplifier circuit allows the carrier amplifier to operate with a power close to a saturation power and to achieve a high efficiency (the broken line shown by (b) in FIG. 14). However, downsizing the carrier amplifier deteriorates the thermal resistance (the solid line shown by (b) in FIG. 14). Generally speaking, as shown by (b) in FIG. 14, there is a demand for the Doherty amplifier circuit to have an efficiency greater than or equal to a certain value and a thermal resistance less than or equal to a certain value.

In the present embodiment, since PA size/CA size is at least 1.5 and at most 1.7 (approximately 1.6), it is possible to achieve an efficiency greater than or equal to a desired value and a thermal resistance less than or equal to a desired value ((c) in FIG. 14).

Embodiment 15

Next, the following will describe, as Embodiment 15, a monolithic semiconductor device in which, in a plan view of the substrate, the first active region in which the first transistor is disposed has an area larger than an area of the second active region in which the second transistor is disposed in Embodiment 13.

Figure 15:
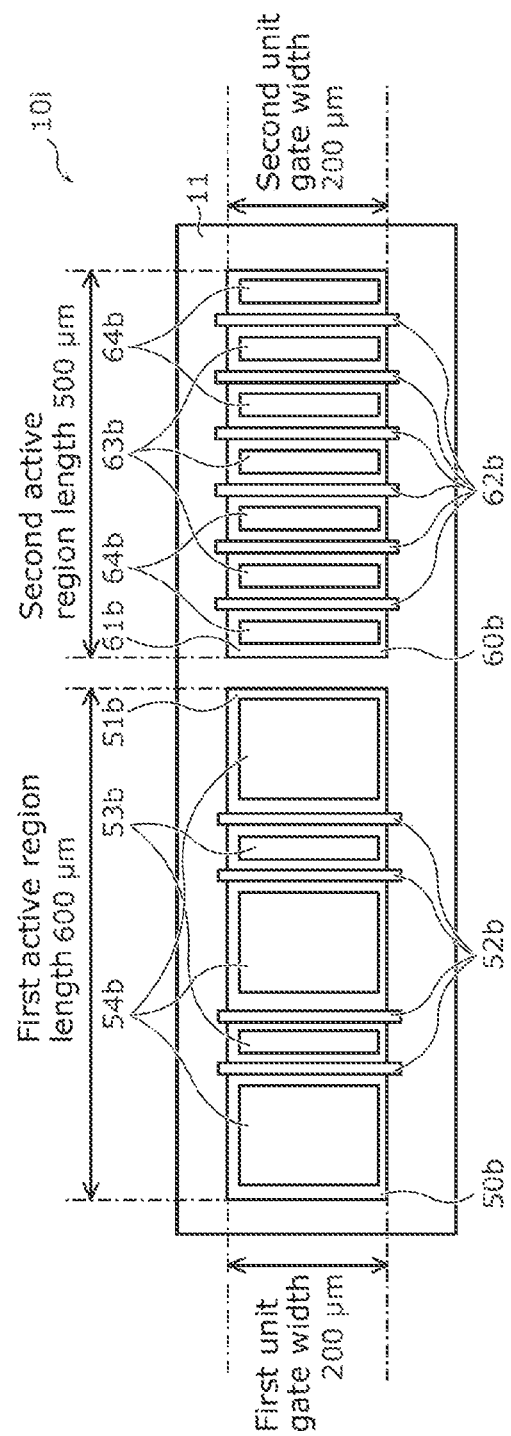
FIG. 15 is a plan layout diagram of a monolithic semiconductor device according to Embodiment 15.

FIG. 15 is a plan layout diagram of monolithic semiconductor device 10i according to Embodiment 15. As in Embodiment 13, monolithic semiconductor device 10i according to the present embodiment is used for a Doherty amplifier circuit including first transistor 50b as a carrier amplifier and second transistor 60b as a peak amplifier.

As shown by FIG. 15, first transistor 50b comprises four parallel-connected unit transistors disposed in continuous first active region 51b, and includes four gate electrodes 52b, two drain electrodes 53b, and three source electrodes 54b. Second transistor 60b comprises six parallel-connected unit transistors disposed in continuous second active region 61b, and includes six gate electrodes 62b, three drain electrodes 63b, and four source electrodes 64b.

Here, first transistor 50b has a first unit gate electrode width of 200 µm that is a gate electrode width per gate electrode of first transistor 50b, and second transistor 60b has a second unit gate electrode width of 200 µm that is a gate electrode width per gate electrode of second transistor 60b. Moreover, first active region 51b has a length of 600 µm, and second active region 61b has a length of 500 µm. Accordingly, in the present embodiment, first active region 51b has the area (120000 µm²) larger than the area (100000 µm²) of second active region 61b in a plan view of substrate 11.

In the Doherty amplifier circuit, the carrier amplifier (first transistor 50b) operating continuously generates a large amount of heat, compared to the peak amplifier (second transistor 60b) operating only at the time of peak power of a signal. In monolithic semiconductor device 10i according to the present embodiment, since first active region 51b in which first transistor 50b is disposed has the area larger than the area of second active region 61b in which second transistor 60b is disposed, a heat source of the carrier amplifier (first transistor 50b) that generates a greater amount of heat is dispersedly located, and it is possible to allow the carrier amplifier (first transistor 50b) to operate at a lower temperature.

Embodiment 16

Next, the following will describe, as Embodiment 16, a monolithic semiconductor device in which, in a plan view of the substrate, a value obtained by dividing an area of the first active region by a conduction current capacity of the first transistor is higher than a value obtained by dividing an area of the second active region by a conduction current capacity of the second transistor described in Embodiment 13.

Figure 16:
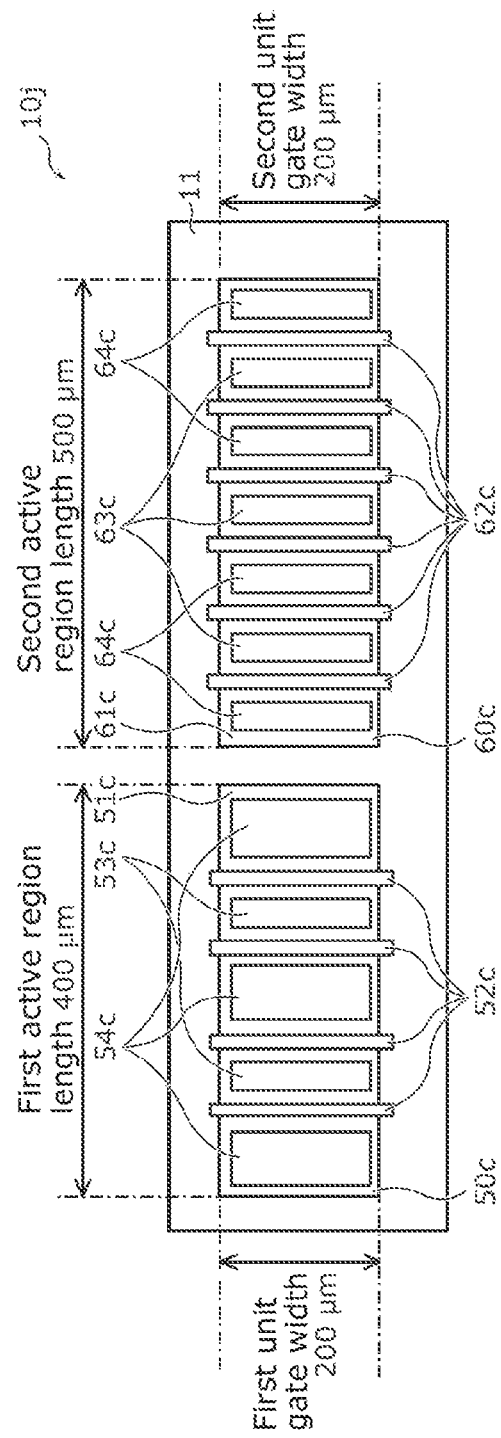
FIG. 16 is a plan layout diagram of a monolithic semiconductor device according to Embodiment 16.

FIG. 16 is a plan layout diagram of monolithic semiconductor device 10j according to Embodiment 16. As in Embodiment 13, monolithic semiconductor device 10j according to the present embodiment is used for a Doherty amplifier circuit including first transistor 50c as a carrier amplifier and second transistor 60c as a peak amplifier.

As shown by FIG. 16, first transistor 50c comprises four parallel-connected unit transistors disposed in continuous first active region 51c, and includes four gate electrodes 52c, two drain electrodes 53c, and three source electrodes 54c. Second transistor 60c comprises six parallel-connected unit transistors disposed in continuous second active region 61c, and includes six gate electrodes 62c, three drain electrodes 63c, and four source electrodes 64c.

Here, first transistor 50c has a first unit gate electrode width of 200 µm that is a gate electrode width per gate electrode of first transistor 50c, and second transistor 60c has a second unit gate electrode width of 200 µm that is a gate electrode width per gate electrode of second transistor 60c. Moreover, first active region 51c has a length of 400 µm, and second active region 61c has a length of 500 µm. Accordingly, in the present embodiment, first active region 51c has an area of 80000 µm², and second active region 61c has an area of 100000 µm², in a plan view of substrate 11.

Moreover, since a conduction current capacity of a transistor is proportional to a value obtained by multiplying a unit gate electrode width and a gate electrode count, a ratio between the conduction current capacity of first transistor 50c and the conduction current capacity of second transistor 60c is 2:3.

Accordingly, in the present embodiment, a value (40000) obtained by dividing the area (80000 µm²) of first active region 51c by the conduction current capacity (2) of first transistor 50c is higher than a value (approximately 33333) obtained by dividing the area (100000 µm²) of second active region 61c by the conduction current capacity (3) of second transistor 60c, in a plan view of substrate 11.

With such a characteristic, a heat source of the carrier amplifier (first transistor 50c) that generates a greater amount of heat is dispersedly located, and it is possible to allow the carrier amplifier (first transistor 50c) to operate at a lower temperature.

Embodiment 17

Next, the following will describe, as Embodiment 17, a monolithic semiconductor device characterized by source regions included in the first transistor described in Embodiment 13.

Figure 17:
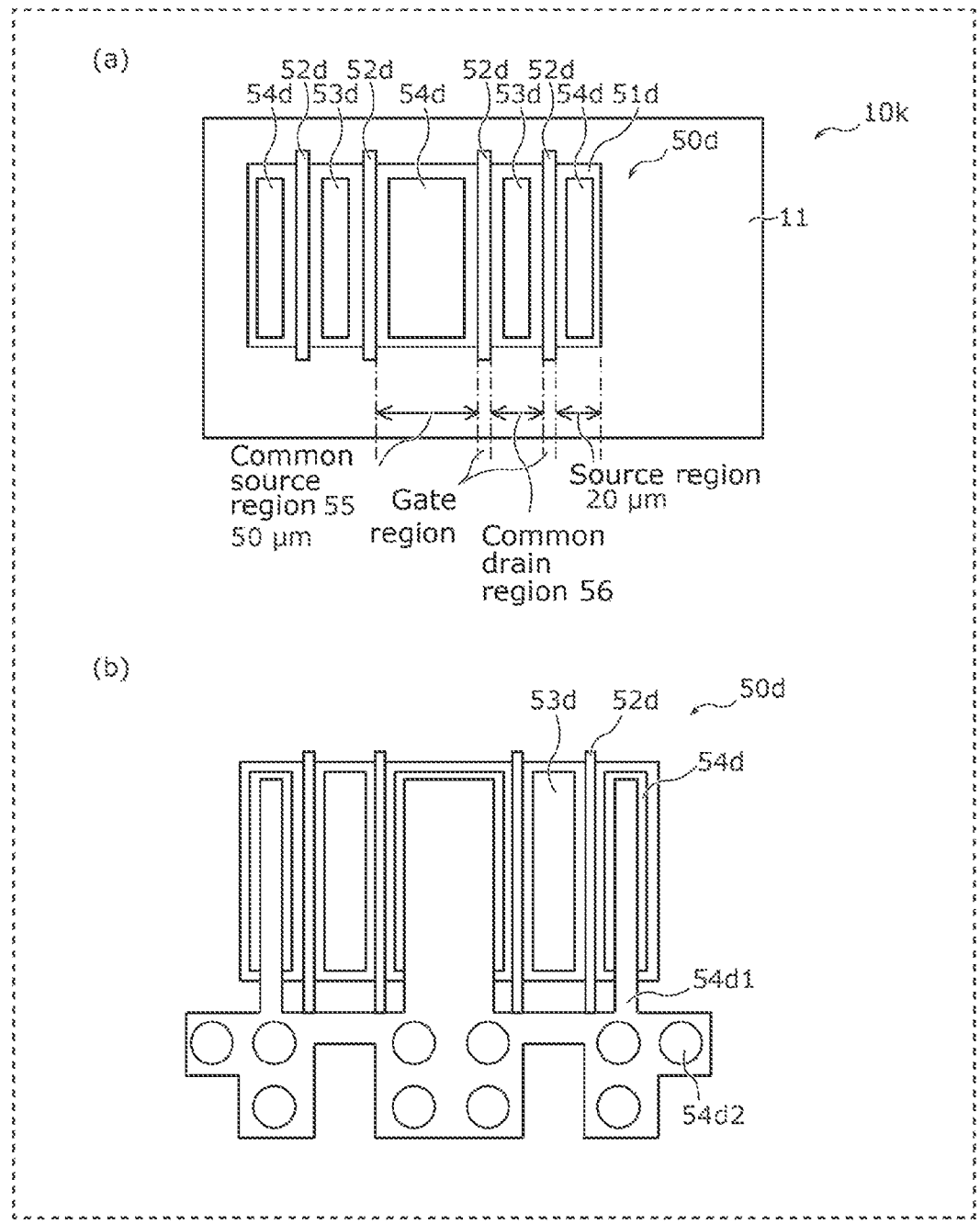
FIG. 17 is a plan layout diagram of a monolithic semiconductor device according to Embodiment 17.

FIG. 17 is a plan layout diagram of monolithic semiconductor device 10k according to Embodiment 17. It should be noted that the figure shows only a plan layout of characteristic first transistor 50d and omits a second transistor. More specifically, (a) in FIG. 17 shows a plan layout of only first transistor 50d, and (b) in FIG. 17 shows a plan layout of first transistor 50d including source wiring.

As shown by (a) in FIG. 17, first transistor 50d comprises four parallel-connected unit transistors disposed in continuous first active region 51d, and includes four gate electrodes 52d disposed in gate regions in first active region 51d, two drain electrodes 53d disposed in drain regions in first active region 51d, and three source electrodes 54d disposed in source regions in first active region 51d.

Central source electrode 54d among three source electrodes 54d is disposed in common source region 55 that is a source region common to two adjacent unit transistors. Common source region 55 has a length of 50 µm. The other source regions including a source region closest to an outer peripheral side of substrate 11 have a length of 20 µm. Moreover, two drain electrodes 53d are disposed in common drain region 56 that is a drain region common to two adjacent unit transistors.

In monolithic semiconductor device 10k according to the present embodiment thus configured, in a first direction in which the source regions, gate regions, and drain regions of the unit transistors included in first transistor 50d are arranged, the length (20 µm) of the source regions and half the length (25 µm) of common source region 55 are not uniform (i.e., different).

Moreover, in the first direction in which the source regions, gate regions, and drain regions of the unit transistors included in first transistor 50d are arranged, the length (20 µm) of the source region closest to the outer peripheral side of substrate 11 is less than half the length (25 µm) of common source region 55.

Downsizing a source region in an end portion due to such a characteristic of the plan layout makes it possible to use an empty space for heat radiation and to dispose, for example, a bonding pad, which enables both good heat radiation and a reduction of an increase in chip size.

Furthermore, as shown in the plan layout shown by (b) in FIG. 17, for the sake of grounding, source electrode 54d is connected to source wiring 54d1 connected to a back surface of substrate 11 via via holes 54d2. It should be noted that although via holes 54d2 are arranged in two rows to reduce source inductance in the present embodiment, via holes at respective ends may be arranged in one row since a current of closest source regions is halved. Such a layout makes it possible to dispose an element such as a bonding pad in a portion immediately below one row of via holes 54d2 at respective ends, which achieves a high area efficiency.

Embodiment 18

Next, the following will describe, as Embodiment 18, a monolithic semiconductor device characterized by positions of gate regions included in the first transistor described in Embodiment 13.

Figure 18:
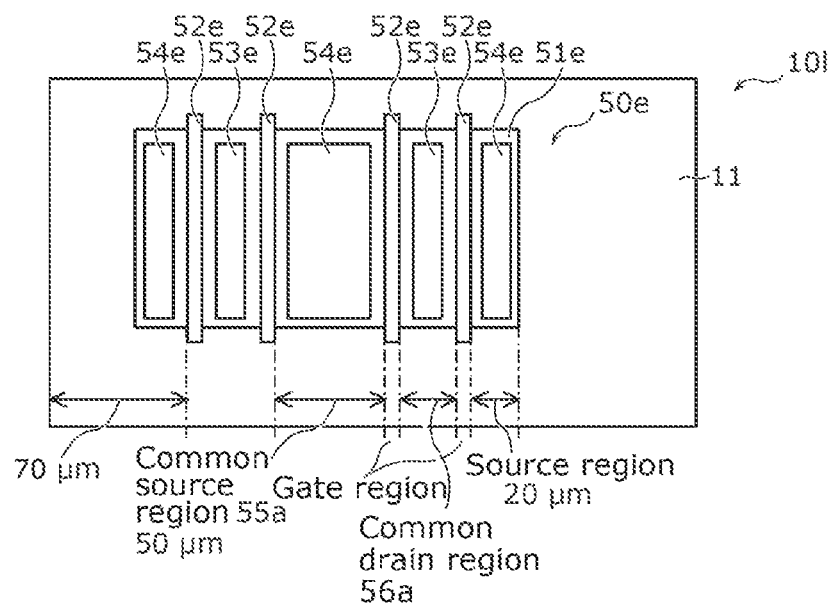
FIG. 18 is a plan layout diagram of a monolithic semiconductor device according to Embodiment 18.

FIG. 18 is a plan layout diagram of monolithic semiconductor device 10l according to Embodiment 18. It should be noted that the figure shows only a plan layout of characteristic first transistor 50e and omits a second transistor.

As shown by FIG. 18, first transistor 50e comprises four parallel-connected unit transistors disposed in continuous first active region 51e, and includes four gate electrodes 52e disposed in gate regions in first active region 51e, two drain electrodes 53e disposed in drain regions in first active region 51e, and three source electrodes 54e disposed in source regions in first active region 51e.

Central source electrode 54e among three source electrodes 54e is disposed in common source region 55a that is a source region common to two adjacent unit transistors. Common source region 55a has a length of 50 µm. The other source regions including a source region closest to an outer peripheral side of substrate 11 have a length of 20 µm. Moreover, two drain electrodes 53e are disposed in common drain region 56a that is a drain region common to two adjacent unit transistors.

Here, in a first direction in which the source regions, gate regions, and drain regions of the unit transistors included in first transistor 50e are arranged, a length from an outer peripheral side of substrate 11 to a gate region closest to the outer peripheral side is 70 µm and greater than half the length (25 µm) of common source region 55a.

Downsizing a source region in an end portion due to such a characteristic of the plan layout makes it possible to use an empty space for heat radiation and to dispose, for example, a bonding pad, which enables both good heat radiation and a reduction of an increase in chip size.

Embodiment 19

Next, the following will describe, as Embodiment 19, a monolithic semiconductor device characterized by a common source region and a common drain region included in the first transistor described in Embodiment 13.

Figure 19:
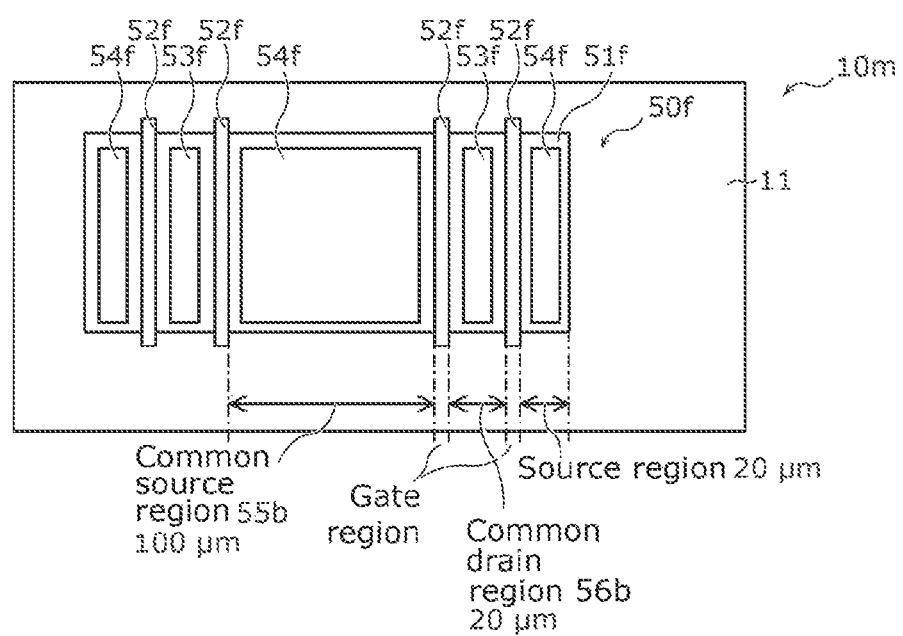
FIG. 19 is a plan layout diagram of a monolithic semiconductor device according to Embodiment 19.

FIG. 19 is a plan layout diagram of monolithic semiconductor device 10m according to Embodiment 19. It should be noted that the figure shows only a plan layout of characteristic first transistor 50f and omits a second transistor.

As shown by FIG. 19, first transistor 50f comprises four parallel-connected unit transistors disposed in continuous first active region 51f, and includes four gate electrodes 52f disposed in gate regions in first active region 51f, two drain electrodes 53f disposed in drain regions in first active region 51f, and three source electrodes 54f disposed in source regions in first active region 51f. Central source electrode 54f among three source electrodes 54f is disposed in common source region 55b that is a source region common to two adjacent unit transistors. Common source region 55b has a length of 100 µm. Moreover, two drain electrodes 53f are disposed in common drain region 56b that is a drain region common to two adjacent unit transistors. Common drain region 56b has a length of 20 µm. As stated above, in a first direction in which the source regions, gate regions, and drain regions of the unit transistors included in first transistor 50f are arranged, the length (100 µm) of common source region 55b is greater than the length (20 µm) of common drain region 56b.

Generally speaking, when the source of a transistor and the back surface of a substrate are connected to ground, capacitance provided by a drain region and the back surface of the substrate is made equal to drain-source capacitance of the transistor. As a result, an increase in drain-source capacitance leads to a decrease in efficiency of an amplifier circuit.

In monolithic semiconductor device 10m according to the present embodiment, since the length of common source region 55b is greater than the length of common drain region 56b, it is possible to expand a heat generating area to reduce a thermal resistance without increasing drain-source capacitance.

Embodiment 20

Next, a hybrid semiconductor device according to Embodiment 20 will be described.

Figure 20:
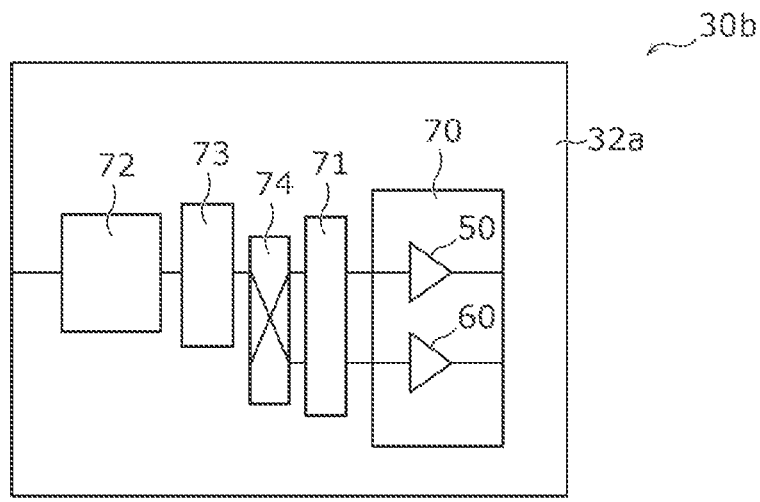
FIG. 20 is a plan layout diagram of a hybrid semiconductor device according to Embodiment 20.

FIG. 20 is a plan layout diagram of hybrid semiconductor device 30b according to Embodiment 20. Hybrid semiconductor device 30b includes: submount substrate 32a; first monolithic semiconductor device 70 that is monolithic semiconductor device 10g according to Embodiment 13 mounted on submount substrate 32a and constituting a Doherty amplifier circuit; input matching circuit area 71 for first monolithic semiconductor device 70; second monolithic semiconductor device 72; output matching circuit area 73 for second monolithic semiconductor device 72; and coupler 74 that distributes an output signal from output matching circuit area 73 into a signal for first transistor 50 and a signal for second transistor 60 and outputs these signals to input matching circuit area 71. Second monolithic semiconductor device 72 includes an amplifier circuit that amplifies and outputs a radio-frequency signal to first monolithic semiconductor device 70.

In hybrid semiconductor device 30b according to the present embodiment thus configured, since different monolithic semiconductor devices constitute the Doherty amplifier circuit and a pre-stage amplifier circuit of the Doherty amplifier circuit, it is possible to dispose an output matching circuit of second monolithic semiconductor device 72, coupler 74, and an input matching circuit of first monolithic semiconductor device 70 between the Doherty amplifier circuit and the pre-stage amplifier circuit, and a multiple-stage Doherty amplifier circuit is achieved with a small area.

Embodiment 21

Next, a hybrid semiconductor device according to Embodiment 21 will be described.

Figure 21:
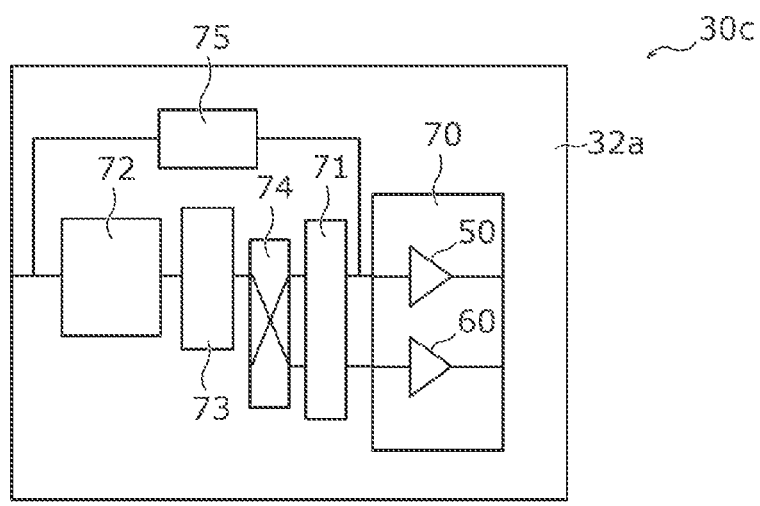
FIG. 21 is a plan layout diagram of a hybrid semiconductor device according to Embodiment 21.

FIG. 21 is a plan layout diagram of hybrid semiconductor device 30c according to Embodiment 21. Hybrid semiconductor device 30c includes a configuration obtained by adding third monolithic semiconductor device 75 to hybrid semiconductor device 30b according to Embodiment 20. Third monolithic semiconductor device 75 includes a first bias circuit that applies bias voltage to the gate of first transistor 50 included in first monolithic semiconductor device 70 and the gate of a transistor included in second monolithic semiconductor device 72. The first bias circuit is, for example, the bias circuit described in Embodiment 1 or Embodiment 4.

In hybrid semiconductor device 30c according to the present embodiment thus configured, disposing the bias circuit in hybrid semiconductor device 30c eliminates the need for a bias circuit outside hybrid semiconductor device 30c, and an amplifier circuit is achieved with a small area.

Embodiment 22

Next, a hybrid semiconductor device according to Embodiment 22 will be described.

Figure 22:
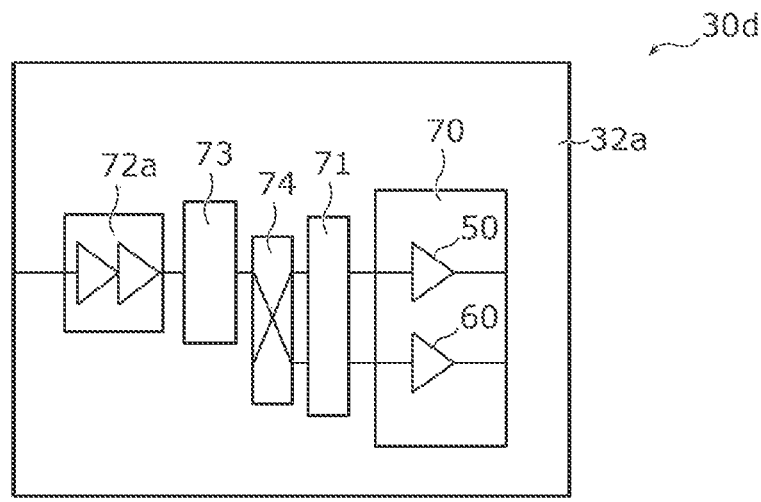
FIG. 22 is a plan layout diagram of a hybrid semiconductor device according to Embodiment 22.

FIG. 22 is a plan layout diagram of hybrid semiconductor device 30d according to Embodiment 22. Hybrid semiconductor device 30d basically includes the same configuration as hybrid semiconductor device 30b according to Embodiment 20. In the present embodiment, however, second monolithic semiconductor device 72a included in hybrid semiconductor device 30d includes a multiple-stage amplifier in which amplifier circuits are connected in cascade.

Since hybrid semiconductor device 30d according to the present embodiment thus configured includes second monolithic semiconductor device 72a constituting the multiple-stage amplifier, hybrid semiconductor device 30d has a high gain and makes it possible to reduce input signal strength of hybrid semiconductor device 30d and to perform highly efficient amplification.

Embodiment 23

Next, a hybrid semiconductor device according to Embodiment 23 will be described.

Figure 23:
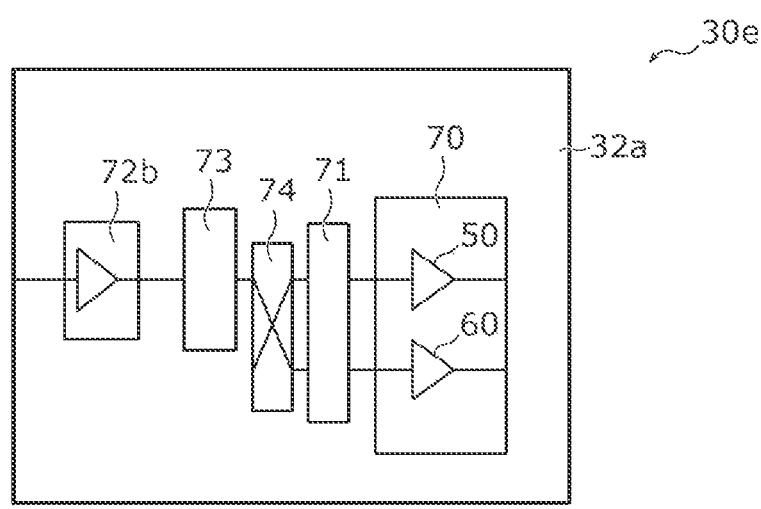
FIG. 23 is a plan layout diagram of a hybrid semiconductor device according to Embodiment 23.

FIG. 23 is a plan layout diagram of hybrid semiconductor device 30e according to Embodiment 23. Hybrid semiconductor device 30e basically includes the same configuration as hybrid semiconductor device 30b according to Embodiment 20. In the present embodiment, however, second monolithic semiconductor device 72b included in hybrid semiconductor device 30e includes a single-stage amplifier.

Since hybrid semiconductor device 30e according to the present embodiment thus configured includes second monolithic semiconductor device 72b including the single-stage amplifier, hybrid semiconductor device 30e makes it possible to decrease the area of second monolithic semiconductor device 72b, and an amplifier circuit having a high gain is achieved with a small area.

Embodiment 24

Next, a hybrid semiconductor device according to Embodiment 24 will be described.

Figure 24:
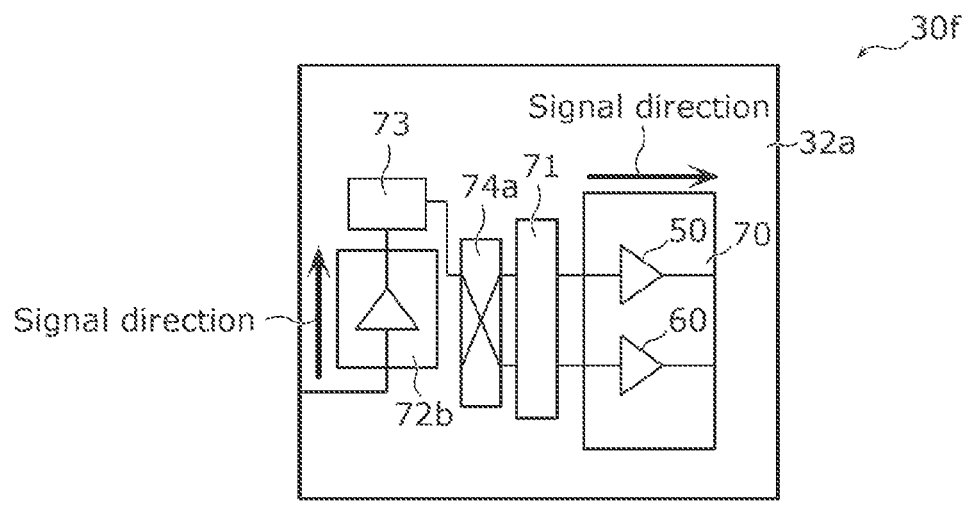
FIG. 24 is a plan layout diagram of a hybrid semiconductor device according to Embodiment 24.

FIG. 24 is a plan layout diagram of hybrid semiconductor device 30f according to Embodiment 24. Hybrid semiconductor device 30f basically includes the same configuration as hybrid semiconductor device 30e according to Embodiment 23. In the present embodiment, however, first monolithic semiconductor device 70 and second monolithic semiconductor device 72b included in hybrid semiconductor device 30f are disposed on submount substrate 32a so that radio-frequency signal transmission directions of first monolithic semiconductor device 70 and second monolithic semiconductor device 72b are not parallel (here, are orthogonal) in a plan view.

Moreover, in the present embodiment, coupler 74a includes a wiring pattern on submount substrate 32a. To put it another way, coupler 74a is disposed between (i) an amplifier circuit included in second monolithic semiconductor device 72b and (ii) first transistor and second transistor 60 included in first monolithic semiconductor device 70 due to the wiring pattern, and distributively transmits a radio-frequency output signal from the amplifier circuit included in second monolithic semiconductor device 72b to the gate of each of first transistor 50 and second transistor 60.

In hybrid semiconductor device 30f according to the present embodiment thus configured, since the radio-frequency signal transmission directions of first monolithic semiconductor device 70 and second monolithic semiconductor device 72b are not parallel, output matching circuit area 73 for second monolithic semiconductor device 72b need not be disposed between first monolithic semiconductor device 70 and second monolithic semiconductor device 72b, and a Doherty amplifier circuit is achieved with a small area.

Moreover, since coupler 74a includes the wiring pattern on submount substrate 32a, it is not necessary to provide a special component for coupler 74a, and a Doherty amplifier circuit is achieved at low cost.

Embodiment 25

Next, a hybrid semiconductor device according to Embodiment 25 will be described.

Figure 25:
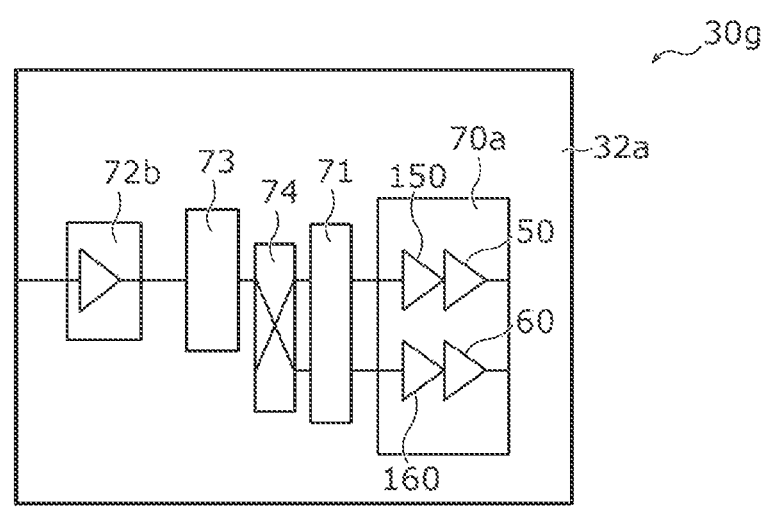
FIG. 25 is a plan layout diagram of a hybrid semiconductor device according to Embodiment 25.

FIG. 25 is a plan layout diagram of hybrid semiconductor device 30g according to Embodiment 25. Hybrid semiconductor device 30g basically includes the same configuration as hybrid semiconductor device 30e according to Embodiment 23. In the present embodiment, however, first monolithic semiconductor device 70a included in hybrid semiconductor device 30g includes, in addition to first transistor 50 and second transistor 60, first pre-stage amplifier 150 that is a pre-amplifier of first transistor 50, and second pre-stage amplifier 160 that is a pre-amplifier of second transistor 60.

As in Embodiment 23, first monolithic semiconductor device 70a serves as a Doherty amplifier circuit. However, a multiple-stage amplifier that is a combination of first pre-stage amplifier 150 and first transistor 50 serves as a carrier amplifier of the Doherty amplifier circuit, and a multiple-stage amplifier that is a combination of second pre-stage amplifier 160 and second transistor 60 serves as a peak amplifier of the Doherty amplifier circuit.

In hybrid semiconductor device 30g according to the present embodiment thus configured, since first monolithic semiconductor device 70a includes the multiple-stage amplifier, it is possible to reduce output power of second monolithic semiconductor device 72b to decrease operating current, and an amplifier circuit having a high efficiency is achieved.

Embodiment 26

Next, a hybrid semiconductor device according to Embodiment 26 will be described.

Figure 26:
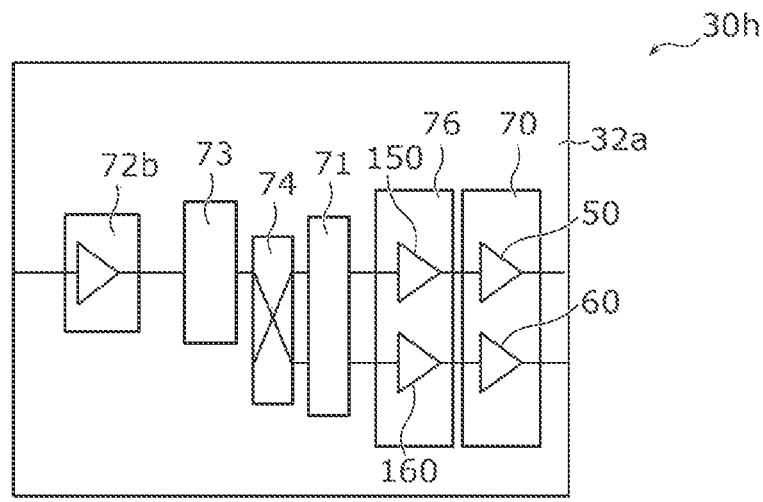
FIG. 26 is a plan layout diagram of a hybrid semiconductor device according to Embodiment 26.

FIG. 26 is a plan layout diagram of hybrid semiconductor device 30h according to Embodiment 26. Hybrid semiconductor device 30h basically includes the same configuration as hybrid semiconductor device 30g according to Embodiment 25. In hybrid semiconductor device 30h according to the present embodiment, however, first transistor 50 and second transistor 60 described in Embodiment 25 are disposed in first monolithic semiconductor device 70, and first pre-stage amplifier 150 and second pre-stage amplifier 160 are disposed in fourth monolithic semiconductor device 76. In other words, first pre-stage amplifier 150 and second pre-stage amplifier 160 are disposed on submount substrate 32a, in positions other than the position of first monolithic semiconductor device 70.

In hybrid semiconductor device 30h according to the present embodiment thus configured, since a pre-stage amplifier and a post-stage amplifier are disposed in different monolithic semiconductor devices (fourth monolithic semiconductor device 76 and first monolithic semiconductor device 70, respectively), it is possible to reduce thermal interference of fourth monolithic semiconductor device 76 and first monolithic semiconductor device 70, and a high heat radiation effect is produced.

Embodiment 27

Next, a hybrid semiconductor device according to Embodiment 27 will be described.

Figure 27:
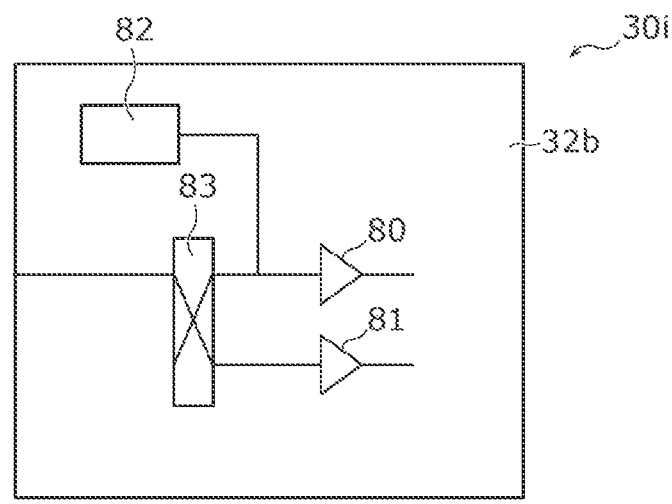
FIG. 27 is a plan layout diagram of a hybrid semiconductor device according to Embodiment 27.

FIG. 27 is a plan layout diagram of hybrid semiconductor device 30i according to Embodiment 27. Hybrid semiconductor device 30i includes: submount substrate 32b; carrier amplifier 80 and peak amplifier 81 that are disposed on submount substrate 32b and constitute a Doherty amplifier circuit; bias circuit 82 that is disposed on submount substrate 32b and applies bias voltage to carrier amplifier 80; and coupler 83 that distributively transmits an inputted radio-frequency signal to each of carrier amplifier 80 and peak amplifier 81.

More specifically, carrier amplifier 80 is, for example, first transistor 12 described in Embodiment 8. Peak amplifier 81 is, for example, third transistor 40 described in Embodiment 8. Bias circuit 82 is, for example, first bias circuit 20 described in Embodiment 8. Coupler 83 is, for example, coupler 74a described in Embodiment 24.

In hybrid semiconductor device 30i according to the present embodiment thus configured, since bias circuit 82 is disposed in hybrid semiconductor device 30i, a bias circuit outside hybrid semiconductor device 30i becomes unnecessary, and a Doherty amplifier circuit is achieved with a small area.

It should be noted that bias circuit 82 may apply bias voltage not only to carrier amplifier 80 but also to both carrier amplifier 80 and peak amplifier 81.

Embodiment 28

Next, a hybrid semiconductor device according to Embodiment 28 will be described.

Figure 28:
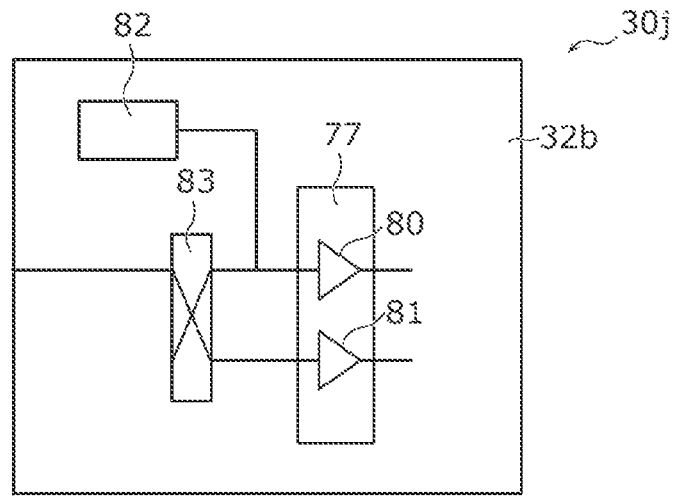
FIG. 28 is a plan layout diagram of a hybrid semiconductor device according to Embodiment 28.

FIG. 28 is a plan layout diagram of hybrid semiconductor device 30j according to Embodiment 28. Hybrid semiconductor device 30j basically includes the same configuration as hybrid semiconductor device 30i according to Embodiment 27. However, carrier amplifier 80 and peak amplifier 81 are disposed in same fifth monolithic semiconductor device 77. Carrier amplifier 80 and peak amplifier 81 each include a single-stage amplifier.

In hybrid semiconductor device 30j according to the present embodiment thus configured, since carrier amplifier 80 and peak amplifier 81 are disposed on the same monolithic semiconductor device, it is possible to reduce a difference in characteristics of transistors which operate as the amplifiers, and a stable Doherty amplifier circuit is achieved.

Moreover, in hybrid semiconductor device 30j according to the present embodiment, since the Doherty amplifier circuit includes the single-stage amplifiers, it is possible to decrease the area of fifth monolithic semiconductor device 77, and the Doherty amplifier circuit is achieved with a small area.

Embodiment 29

Next, a hybrid semiconductor device according to Embodiment 29 will be described.

Figure 29:
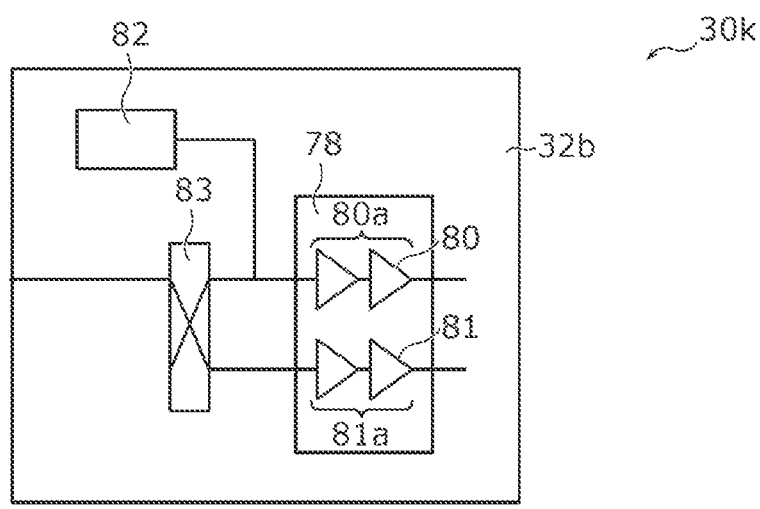
FIG. 29 is a plan layout diagram of a hybrid semiconductor device according to Embodiment 29.

FIG. 29 is a plan layout diagram of hybrid semiconductor device 30k according to Embodiment 29. Hybrid semiconductor device 30k basically includes the same configuration as hybrid semiconductor device 30i according to Embodiment 27. However, carrier amplifier 80a and peak amplifier 81a are disposed in same sixth monolithic semiconductor device 78. Moreover, carrier amplifier 80a and peak amplifier 81a each include a multiple-stage amplifier. Sixth monolithic semiconductor device 78 is, for example, first monolithic semiconductor device 70a described in Embodiment 25.

In hybrid semiconductor device 30k according to the present embodiment thus configured, since the Doherty amplifier circuit includes the multiple-stage amplifiers, the Doherty amplifier circuit having a high gain is achieved. As a result, it is possible to reduce input signal strength of hybrid semiconductor device 30k, and efficient amplification is achieved.

Embodiment 30

Next, a monolithic semiconductor device according to Embodiment 30 will be described.

Figure 30:
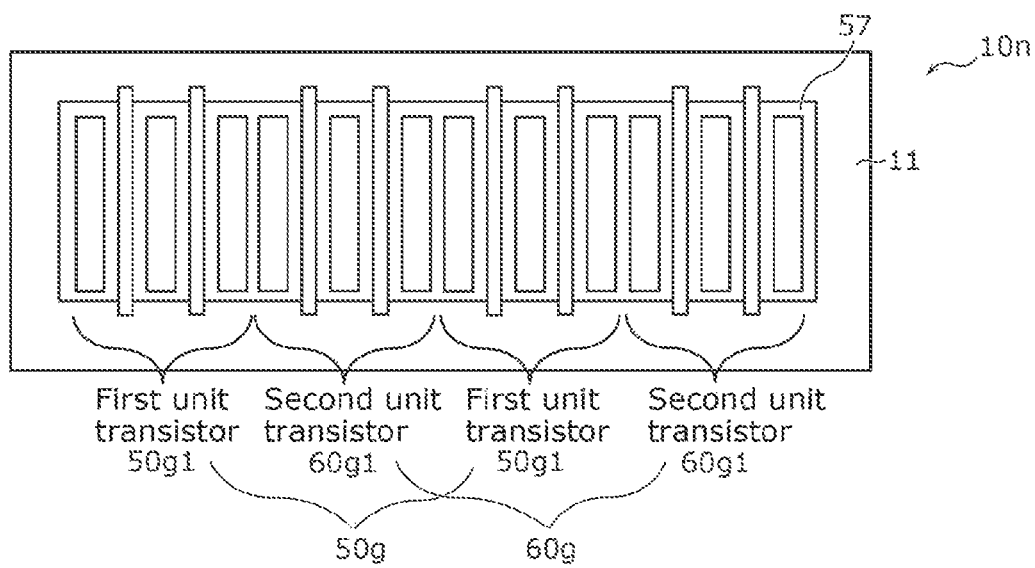
FIG. 30 is a plan layout diagram of a monolithic semiconductor device according to Embodiment 30.

FIG. 30 is a plan layout diagram of monolithic semiconductor device 10n according to Embodiment 30. Monolithic semiconductor device 10n includes substrate 11 and first transistor 50g and second transistor 60g of the HEMT type that are disposed on substrate 11. Monolithic semiconductor device 10n is used for a Doherty amplifier circuit including first transistor 50g as a carrier amplifier and second transistor 60g as a peak amplifier.

As shown by FIG. 30, first transistor 50g and second transistor 60g comprise first unit transistors 50g1 and second unit transistors 60g1, respectively, disposed in continuous active region 57. First unit transistors 50g1 and second unit transistors 60g1 are arranged alternately with each other.

It should be noted that a cross section structure of first unit transistors 50g1 and second unit transistors 60g1 is the same as the structure shown by (b) in FIG. 1. To put it another way, first nitride semiconductor layer 102 including GaN etc. is disposed on substrate 11. Second nitride semiconductor layer 103 including AlGaN etc. and having a band gap larger than a band gap of first nitride semiconductor layer 102 is disposed on first nitride semiconductor layer 102. Drain electrode 110, gate electrode 111, and source electrode 112 isolated by insulating layer 106 including SiN etc. are disposed on second nitride semiconductor layer 103.

Two-dimensional electron gas layer 107 is disposed in an interface between first nitride semiconductor layer 102 and second nitride semiconductor layer 103. First unit transistors 50g1 and second unit transistors 60g1 are each a transistor of the HEMT type that is disposed on substrate 11 and includes first nitride semiconductor layer 102 and second nitride semiconductor layer 103.

In monolithic semiconductor device 10n according to the present embodiment thus configured, by expanding a heat generating area of first unit transistor 50g1 used for a carrier amplifier that generates a large amount of heat and by disposing second unit transistor 60g1 used for a peak amplifier that generates a small amount of heat, between two first unit transistors 50g1, it is possible to reduce a thermal resistance without increasing the area of substrate 11.

Embodiment 31

Next, a monolithic semiconductor device according to Embodiment 31 will be described.

Figure 31:
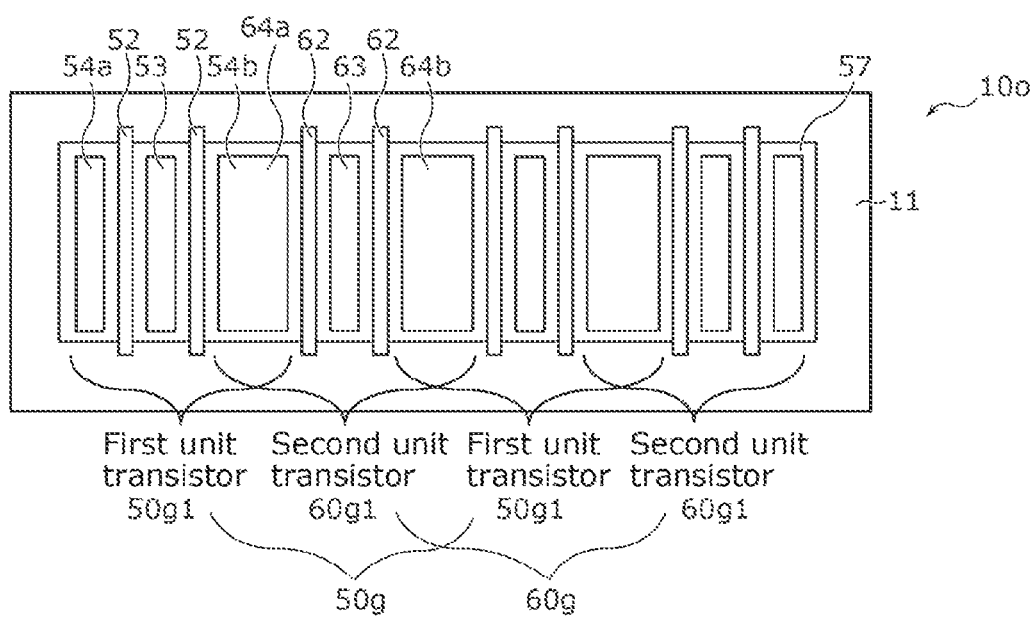
FIG. 31 is a plan layout diagram of a monolithic semiconductor device according to Embodiment 31.

FIG. 31 is a plan layout diagram of monolithic semiconductor device 10o according to Embodiment 31. Monolithic semiconductor device 10o according to the present embodiment basically has the same circuit configuration as monolithic semiconductor device 10n according to Embodiment 30. However, monolithic semiconductor device 10o according to the present embodiment differs from Embodiment 30 in that adjacent unit transistors among first unit transistors 50g1 and second unit transistors 60g1 have respective source regions as common source regions.

More specifically, each of first unit transistors 50g1 has, in active region 57, a first gate region in which gate electrode 52 is disposed, a first drain region in which drain electrode 53 is disposed, and a first source region in which source electrodes 54a and 54b are disposed. Furthermore, each of second unit transistors 60g1 has, in active region 57, a second gate region in which gate electrode 62 is disposed, a second drain region in which drain electrode 63 is disposed, and a second source region in which source electrodes 64a and 64b are disposed. Adjacent first and second unit transistors among first unit transistors 50g1 and second unit transistors 60g1 include, as common source regions, the first source regions in which source electrodes 54b are disposed and the second source regions in which source electrodes 64a are disposed.

In monolithic semiconductor device 10o according to the present embodiment thus configured, by expanding a heat generating area of first unit transistor 50g1 used for a carrier amplifier that generates a large amount of heat and by disposing second unit transistor 60g1 used for a peak amplifier that generates a small amount of heat, between two first unit transistors 50g1, it is possible to reduce a thermal resistance without increasing the area of substrate 11.

Embodiment 32

Next, a monolithic semiconductor device according to Embodiment 32 will be described.

Figure 32:
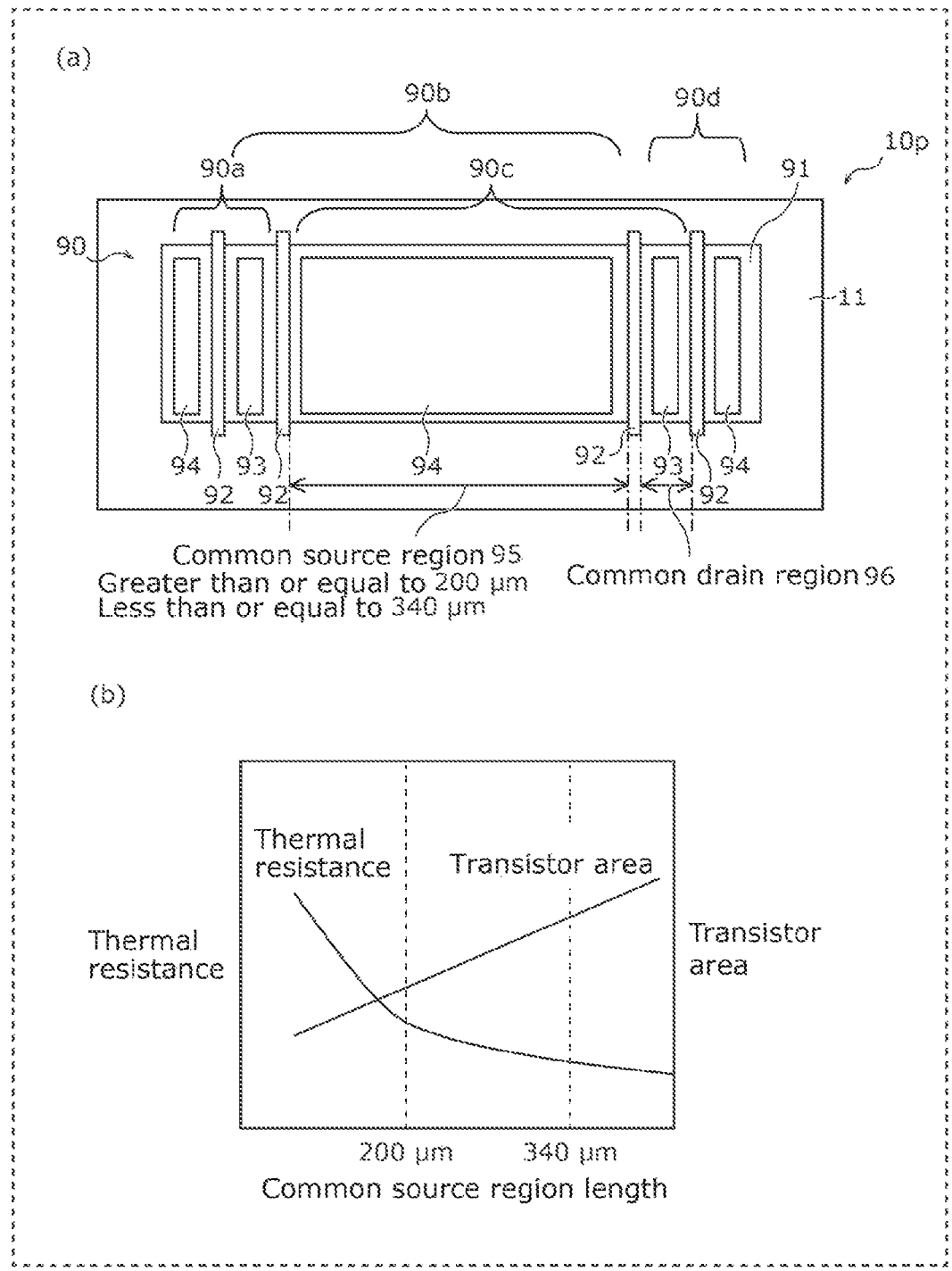
FIG. 32 is a diagram illustrating a monolithic semiconductor device according to Embodiment 32.

FIG. 32 is a diagram illustrating monolithic semiconductor device 10p according to Embodiment 32. More specifically, (a) in FIG. 32 shows a plan layout of monolithic semiconductor device 10p, and (b) in FIG. 32 shows a relationship between a thermal resistance (the solid line, the left vertical axis) relative to a length (the horizontal axis) of a common source region and a transistor area (the solid line, the right vertical axis).

Monolithic semiconductor device 10p includes substrate 11 and transistor 90 of the HEMT type for power amplification disposed on substrate 11. Transistor 90 comprises unit transistors disposed in continuous active region 91. Each of unit transistors 90a to 90d includes, in active region 91, a source region in which source electrode 94 is disposed, a gate region in which gate electrode 92 is disposed, and a drain region in which drain electrode 93 is disposed. Adjacent unit transistors among unit transistors 90a to 90d include common source region 95 having the source regions of the adjacent unit transistors in common or common drain region 96 having the drain regions of the adjacent unit transistors in common. In a direction in which the source regions, gate regions, and drain regions of unit transistors 90a to 90d are arranged, common source region 95 has a length of at least 200 μm and at most 340 μm.

It should be noted that a cross section structure of unit transistors 90a to 90d is the same as the structure shown by (b) in FIG. 1. To put it another way, first nitride semiconductor layer 102 including GaN etc. is disposed on substrate 11. Second nitride semiconductor layer 103 including AlGaN etc. and having a band gap larger than a band gap of first nitride semiconductor layer 102 is disposed on first nitride semiconductor layer 102. Drain electrode 110, gate electrode 111, and source electrode 112 isolated by insulating layer 106 including SiN etc. are disposed on second nitride semiconductor layer 103. Two-dimensional electron gas layer 107 is disposed in an interface between first nitride semiconductor layer 102 and second nitride semiconductor layer 103. Unit transistors 90a to 90d are each a transistor of the HEMT type that is disposed on substrate 11 and includes first nitride semiconductor layer 102 and second nitride semiconductor layer 103.

As shown by "Transistor area" of (b) in FIG. 32, an area of a transistor increases substantially linearly with an increase in length of a common source region. In addition, since a distance between gate regions that are principal heat sources in an amplifier increases with an increase in length of the common source region as shown by "Thermal resistance" of (b) in FIG. 32, a thermal resistance decreases, but when the distance exceeds 200 µm, the degree of decrease in thermal resistance becomes smaller.

Accordingly, in monolithic semiconductor device 10p according to the present embodiment, since common source region 95 has a length of at least 200 µm and at most 340 µm, a low thermal resistance is kept without increasing a transistor area uselessly.

Embodiment 33

Next, a monolithic semiconductor device according to Embodiment 33 will be described.

Figure 33:
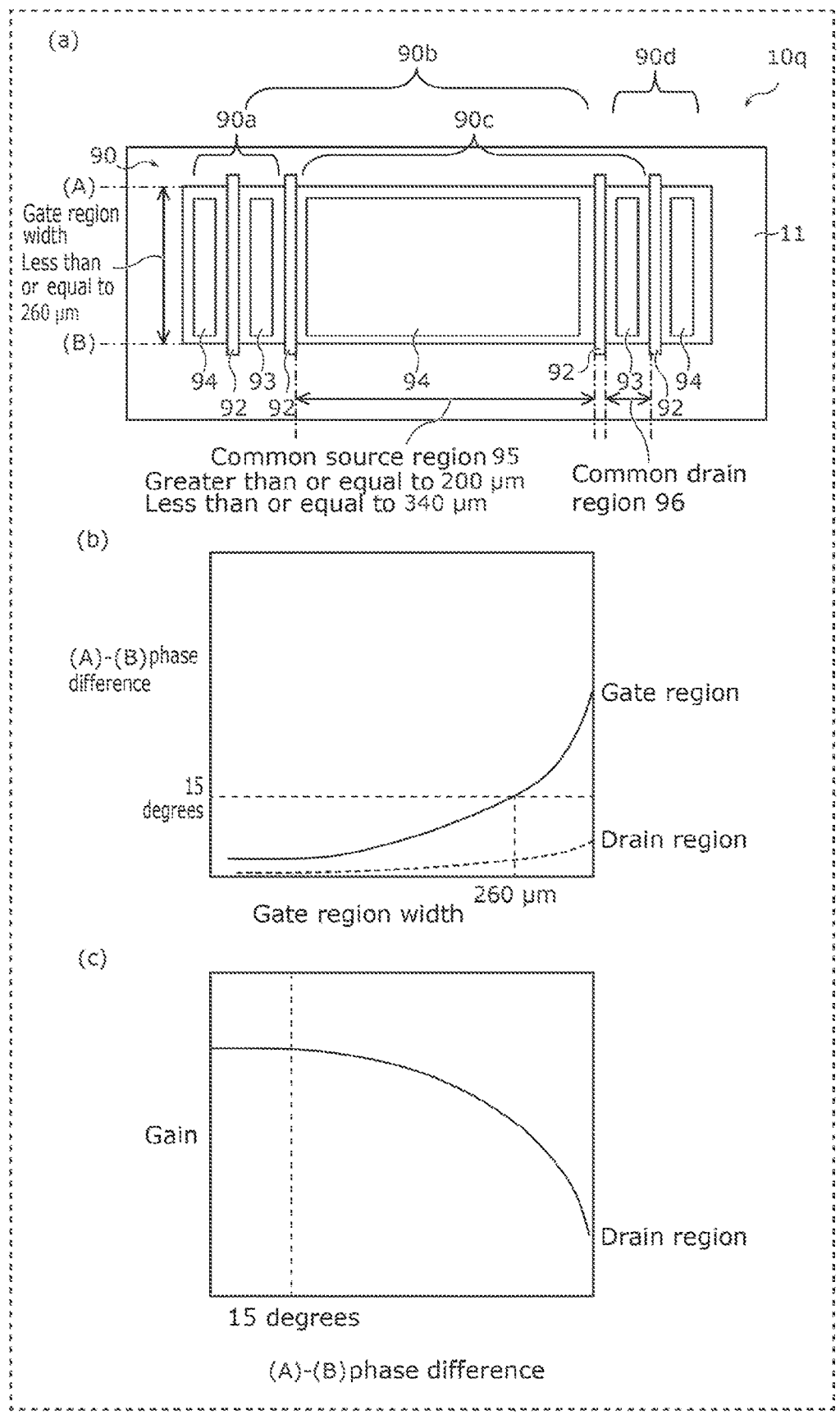
FIG. 33 is a diagram illustrating a monolithic semiconductor device according to Embodiment 33.

FIG. 33 is a diagram illustrating monolithic semiconductor device 10q according to Embodiment 33. More specifically, (a) in FIG. 33 shows a plan layout of monolithic semiconductor device 10q, (b) in FIG. 33 shows a signal phase difference (the solid line) at both ends of a gate region relative to a gate region width (the vertical axis), and a signal phase difference (the broken line) at both ends of a drain region relative to the gate region width, and (c) in FIG. 33 shows a relationship between the signal phase difference at the both ends of the drain region and a gain of a transistor.

Monolithic semiconductor device 10q basically includes the same configuration as described in Embodiment 32. However, in a direction orthogonal to the direction in which the source regions, gate regions, and drain regions of unit transistors 90a to 90d are arranged, a length of the gate regions, that is, a width of the gate regions (a length between (A) and (B) in the figure), is at most 260 µm.

In a radio-frequency amplifying transistor, usually, a signal is inputted to one end of the gate, and an output is outputted from an end of the drain opposite to the one end. Since an amount of phase rotation of a signal in a gate region is greater than an amount of phase rotation of a signal in a drain region, a signal amplified at the input terminal of the transistor becomes out of phase with a signal amplified at the output terminal of the transistor, a phase shift increases ((b) in FIG. 33) with an increase in width of the gate region and drain region in a direction orthogonal to a direction in which a source region, the gate region, and the drain region are arranged, and a gain is reduced ((c) in FIG. 33).

In monolithic semiconductor device 10q according to the present embodiment, the width of the gate regions is at most 260 m, an output phase difference for a signal having a frequency of at least 3 GHz is kept at 15 degrees or less ((b) in FIG. 33), and the reduction of the gain is suppressed ((c) in FIG. 33).

Although the monolithic semiconductor devices and hybrid semiconductor devices in the present disclosure have been described based on Embodiments 1 to 33, the present disclosure is not limited to Embodiments 1 to 33. Forms obtained by making various modifications to each of Embodiments 1 to 33 that can be conceived by a person skilled in the art as well as other forms realized by combining part of the constituent elements in each of the embodiments are included in the scope of the present disclosure, provided that they do not depart from the essence of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The monolithic semiconductor devices and hybrid semiconductor devices according to the present disclosure can be used as a monolithic semiconductor device and a hybrid semiconductor device that include a transistor capable of reducing a workload for adjusting gate voltages individually, for example, as a Doherty amplifier circuit.

The invention claimed is:

1. A monolithic semiconductor device, comprising:
   a substrate including a nitride semiconductor layer;
   a first transistor disposed on the substrate and included in a carrier amplifier of a Doherty amplifier circuit, the first transistor being of a high-electron-mobility transistor (HEMT) type; and
   a first bias circuit that applies bias voltage to a gate of the first transistor, wherein:
   the first bias circuit includes a first resistance element, a second transistor of the HEMT type disposed on the substrate, and a second resistance element that are connected in series in stated order between a first bias terminal and a second bias terminal to which a voltage lower than a voltage applied to the first bias terminal is applied,
   a connecting point between the first resistance element and the second transistor is connected to the gate,
   one end of the first resistance element is connected to a drain of the second transistor,
   a source of the second transistor is connected to one end of the second resistance element,
   an other end of the second resistance element is connected to the second bias terminal,
   a gate of the second transistor is connected to the second bias terminal,
   the first transistor comprises a plurality of first unit transistors disposed in a continuous active region,
   each of the plurality of first unit transistors includes a source region, a first gate finger, and a drain region in the continuous active region,
   an extension direction of second gate fingers included in the second transistor is identical to an extension direction of the first gate fingers in the plurality of first unit transistors, and
   an extended length of the second gate fingers included in the second transistor is shorter than an extended length of the first gate fingers in the plurality of first unit transistors.

2. The monolithic semiconductor device according to claim 1,
   wherein
   adjacent first unit transistors among the plurality of first unit transistors include a common source region having the source regions of the adjacent first unit transistors in common or a common drain region having the drain regions of the adjacent first unit transistors in common, and
   in a first direction in which the source regions, gate regions, and drain regions of the plurality of first unit transistors are arranged, a length of a source region disposed closest to an outer peripheral side of the substrate is less than half a length of the common source region.

3. The monolithic semiconductor device according to claim 1,
   wherein
   adjacent first unit transistors among the plurality of first unit transistors include a common source region having the source regions of the adjacent first unit transistors in common or a common drain region having the drain regions of the adjacent first unit transistors in common, and in a first direction in which the source regions, gate regions, and drain regions of the plurality of first unit transistors are arranged, a length from an outer peripheral side of the substrate to a gate region disposed closest to the outer peripheral side is greater than half a length of the common source region.

4. The monolithic semiconductor device according to claim 1, wherein adjacent first unit transistors among the plurality of first unit transistors include a common source region having the source regions of the adjacent first unit transistors in common or a common drain region having the drain regions of the adjacent first unit transistors in common, in a first direction in which the source regions, gate regions, and drain regions of the plurality of first unit transistors are arranged, the common source region has a length of at least 200 μm and at most 340 μm, and in a direction orthogonal to the first direction in a plan view of the substrate, the gate regions have a length of at most 260 μm.

5. The monolithic semiconductor device according to claim 1, further comprising:

a third transistor of the HEMT type that is disposed on the substrate, included in a peak amplifier of the Doherty amplifier circuit, and has a conduction current capacity greater than a conduction current capacity of the first transistor.

6. The monolithic semiconductor device according to claim 5, further comprising:

a second bias circuit that is disposed on the substrate and applies bias voltage to a gate of the third transistor, wherein the second bias circuit includes no transistors of the HEMT type.

7. The monolithic semiconductor device according to claim 5, wherein the first transistor includes a first active region, and the third transistor includes a second active region smaller in area than the first active region.

8. The monolithic semiconductor device according to claim 5, wherein in a direction in which the first transistor and the third transistor are arranged, the first bias circuit is located between the first transistor and the third transistor or between an outer peripheral side of the substrate and the first transistor.

9. The monolithic semiconductor device according to claim 5, wherein the third transistor comprises a plurality of second unit transistors that are disposed in a continuous active region, each of the plurality of first unit transistors includes a first source region, a first gate region, and a first drain region in the continuous active region, each of the plurality of second unit transistors includes a second source region, a second gate region, and a second drain region in the continuous active region, and adjacent first and second unit transistors among the plurality of first unit transistors and the plurality of second unit transistors include the first source region and the second source region of the adjacent first and second unit transistors as a common source region.

10. A hybrid semiconductor device, comprising:

a submount substrate;

a first monolithic semiconductor device mounted on the submount substrate that is the monolithic semiconductor device according to claim 5; and a second monolithic semiconductor device mounted on the submount substrate and including an amplifier circuit that amplifies and outputs a radio-frequency signal to the first monolithic semiconductor device.

11. The hybrid semiconductor device according to claim 10, wherein the first monolithic semiconductor device and the second monolithic semiconductor device are disposed on the submount substrate so that radio-frequency signal transmission directions of the first monolithic semiconductor device and the second monolithic semiconductor device are not parallel in a plan view of the submount substrate.

12. The hybrid semiconductor device according to claim 10, further comprising:

a third monolithic semiconductor device mounted on the submount substrate and including part of elements of the first bias circuit.

13. A hybrid semiconductor device, comprising:

a first monolithic semiconductor device that is the monolithic semiconductor device according to claim 1 and on which elements excluding at least one of the first resistance element or the second resistance element are disposed; and a second monolithic semiconductor device on which at least one of the first resistance element or the second resistance element is disposed.

14. A hybrid semiconductor device, comprising:

a submount substrate that is quadrilateral in shape in a plan view; and the monolithic semiconductor device according to claim 1 mounted on the submount substrate, wherein the submount substrate includes, on an outer peripheral side of the submount substrate:

a radio-frequency signal input substrate terminal; and an enable control input substrate terminal that controls an activation state of the first bias circuit, and the enable control input substrate terminal is disposed in a substrate terminal position other than a corner substrate terminal position on, among four outer peripheral sides of the submount substrate, an outer peripheral side other than the outer peripheral side on which the radio-frequency signal input substrate terminal is disposed.

* * * * *